US011951631B2

United States Patent
McDaniel

(10) Patent No.: US 11,951,631 B2
(45) Date of Patent: Apr. 9, 2024

(54) OBJECT MARKING TO SUPPORT TASKS BY AUTONOMOUS MACHINES

(71) Applicant: Siemens Aktiengesellschaft, Munich (DE)

(72) Inventor: Richard Gary McDaniel, Hightstown, NJ (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 181 days.

(21) Appl. No.: 17/292,468

(22) PCT Filed: Nov. 19, 2019

(86) PCT No.: PCT/US2019/062195
§ 371 (c)(1),
(2) Date: May 10, 2021

(87) PCT Pub. No.: WO2020/106706
PCT Pub. Date: May 28, 2020

(65) Prior Publication Data
US 2022/0016780 A1 Jan. 20, 2022

Related U.S. Application Data

(60) Provisional application No. 62/769,136, filed on Nov. 19, 2018.

(51) Int. Cl.
*B25J 9/16* (2006.01)

(52) U.S. Cl.
CPC ........... *B25J 9/1671* (2013.01); *B25J 9/1612* (2013.01); *B25J 9/1666* (2013.01); *B25J 9/1687* (2013.01)

(58) Field of Classification Search
CPC ...... B25J 9/1671; B25J 9/1612; B25J 9/1666; B25J 9/163; G05B 2219/31264;
(Continued)

(56) References Cited

U.S. PATENT DOCUMENTS

| 2013/0245824 A1* | 9/2013 | Barajas | B25J 9/1664 |
| | | | 901/46 |
| 2015/0239127 A1* | 8/2015 | Barajas | B25J 9/1671 |
| | | | 700/253 |

(Continued)

FOREIGN PATENT DOCUMENTS

| CN | 103473291 A | 12/2013 |
| CN | 104393359 A | 3/2015 |

(Continued)

OTHER PUBLICATIONS

J. Miura and K. Ikeuchi, "Task-oriented generation of visual sensing strategies in assembly tasks," in IEEE Transactions on Pattern Analysis and Machine Intelligence, vol. 20, No. 2, pp. 126-138, Feb. 1998, doi: 10.1109/34.659931. (Year: 1998).*

(Continued)

*Primary Examiner* — Dale Moyer

(57) ABSTRACT

An autonomous system used for a production process includes a device configured to manipulate workpieces according to production process tasks. A device controller generates world model of the autonomous system to include data objects representing respective physical objects in the production process, such as workspace, workpieces, and the device. Semantic markers attached to the data objects include information related to a skill to accomplish a task objective. Semantic markers may be activated or deactivated depending on whether the physical object is currently available for a task performance. The device is controlled to perform tasks guided by the semantic markers while relying (Continued)

on an anticipation function with reasoning operations based on types of physical objects, types of skills, and configuration of the data objects.

15 Claims, 11 Drawing Sheets

(58) Field of Classification Search
CPC .......... G05B 2219/40323; G05B 17/02; G05B 2219/36017; G05B 19/41885; G06F 30/17; G06F 30/20; Y02P 90/02
See application file for complete search history.

(56) References Cited

U.S. PATENT DOCUMENTS

| | | | |
|---|---|---|---|
| 2016/0221187 A1* | 8/2016 | Bradski | B25J 9/1664 |
| 2018/0250820 A1* | 9/2018 | Shimodaira | B25J 9/1669 |
| 2020/0012265 A1* | 1/2020 | Thomsen | G06F 3/0481 |

FOREIGN PATENT DOCUMENTS

| | | |
|---|---|---|
| CN | 105809200 A | 7/2016 |
| CN | 106447174 A | 2/2017 |
| CN | 108521157 A | 9/2018 |
| DE | 102004001197 A1 | 8/2005 |
| JP | 2017050410 A | 3/2017 |
| WO | 2018031005 A1 | 2/2018 |
| WO | 2018176025 A1 | 9/2018 |
| WO | 2020091725 A1 | 5/2020 |

OTHER PUBLICATIONS

Pedersen, M.R., Nalpantidis, L., Bobick, A.F., & Krüger, V. (2013). On the Integration of Hardware-Abstracted Robot Skills for use in Industrial Scenarios. (Year: 2013).*

Mikkel Rath Pedersen et al: "On the Integration of Hardware-Abstracted Robot Skills for use in Industrial Scenarios", Second International Workshop on Cognitive Robotics Systems: Replicating Human Actions and Activities, Nov. 3, 2013, XP055507180.

International Search Report dated Feb. 18, 2020; Application No. PCT/US2019/062195; 5 pages.

* cited by examiner

OBJECT MARKING TO SUPPORT TASKS BY AUTONOMOUS MACHINES

TECHNICAL FIELD

This application relates to engineering autonomous systems. In particular, this application relates to data objects for implementing reusable skills in autonomous systems.

BACKGROUND

Industrialized manufacturing with state-of-the-art factory designs are based on rather static, inflexible assembly lines. Driven by globalization and increased access to global information, consumer demand for more customized products calls for the rapid and highly dynamic reconfiguration of production processes using cheaper and more flexible machinery. The notion of having a fixed packet industrial communication network between a static set of devices no longer applies. Devices will instead communicate with diverse, description functions that describe more the intended result of the production rather than the specific I/O data values of particular actuators and sensors.

To deal with such complex data, the method for programming devices must likewise change. The manner that machines are programmed today is machine-centric. If the robot is to move left, an instruction is written for it to move left. A large number of motions tends to be required to assemble even two parts. To assemble many parts, the number of assembly instructions becomes large and difficult to manage. Further, it is difficult to find and correct mistakes. In a long sequence of instructions, a missed movement can be difficult to find. Accordingly, simple lists of fixed commands are not sufficient. Standard programming techniques do not consider the effect of the automated device on the work piece and so it cannot say what the ultimate result will be. Autonomous devices are currently limited to processing particular parts, which lacks scalability for assembly of a multiplicity of various parts. Because current automation programs are directed to assembly of parts with a machine-specific context, the program is not scalable to allow other machines to participate in the assembly without modification to the instructions.

SUMMARY

An autonomous system used for a production process includes at least one device configured to manipulate workpieces according to tasks for the production process. The device includes a controller with a memory having stored thereon executable instructions, and a processor configured to execute the instructions to perform the following steps. A world model of the autonomous system is generated to include data objects, with one or more of the data objects representing respective physical objects in the production process as a virtual representation in a simulation. The types of the respective physical objects may include a workspace, one or more workpieces in the workspace, and the device. Semantic markers are attached to the data objects, such that each of the semantic markers includes information related to a skill defined as an abstract function that is to accomplish a task objective. A first set of semantic markers is set to an activated state to trigger applicable skills for data objects on a condition that the physical object is currently available for a task performance. A second set of semantic markers is set to a deactivated state for data objects not to be currently manipulated according to the tasks of the production process. The device is controlled to perform tasks guided by the semantic markers while relying on an anticipation function with reasoning operations based on types of physical objects, types of skills, and configuration of the data objects.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Figure 1:
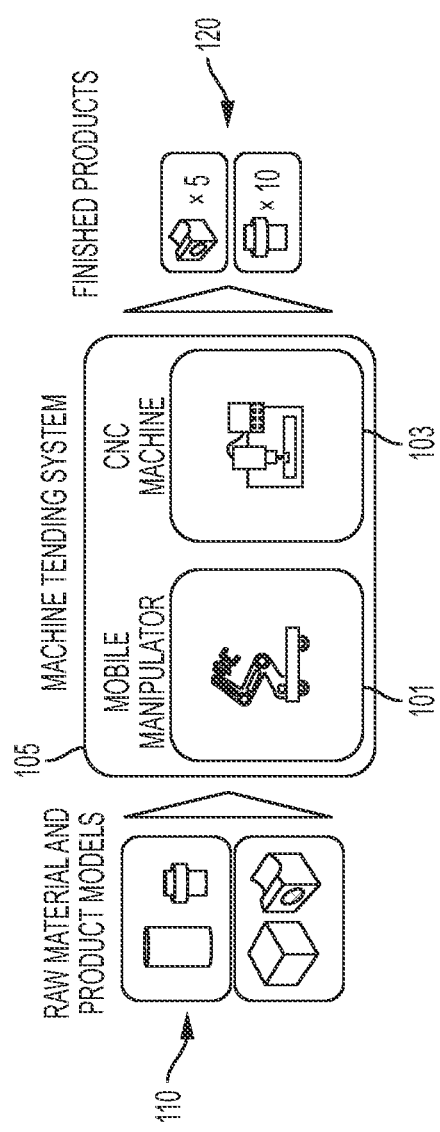
FIG. 1 is a block diagram of a machine tending system according to embodiments of the present disclosure.

A number of factors are changing the way industry develops machinery used to produce goods. For example, devices employed in factories such as conveyor systems and robotics are increasingly becoming more flexible and intelligent. The ability for communicating with devices and amongst controllers has evolved to higher-level network communication standards and is no longer limited to simple numerical Input/output control values. The demands of the consumer continue to change encouraging producers to produce more custom-tailored products while retaining a low price point and associated expense. These changes and others are driving the entire production process toward autonomous and flexible solutions. Accordingly, the nature of how engineers develop such systems must necessarily change.

An autonomous system has three fundamental qualities. First, the devices and their controllers know more about their environment than traditional devices. Advanced sensors detect the presence of objects in a much more general fashion allowing devices to gain knowledge that is unprecedented in traditional production design. Second, production is managed using higher-level abstraction based on the product to be manufactured and less so about the exact method or even the machinery employed to perform the process operations. Third, the system should use its knowledge to recover from unexpected situations. The system should possess algorithms that allow the flow of control to handle interruptions and errors without requiring an engineer to anticipate all possible failure conditions.

Research relating to this disclosure has been performed to study how autonomous systems function, and prototypes were built to show possible capabilities. This research was performed in view of engineering concerns of autonomous systems, as in how an engineer makes an autonomous system. The solution is to provide a higher level of abstraction for the application developer in the engineering tools and domain models. To engineer application context, methods are disclosed to generate a "World Model" of the devices, material, and work products that goes beyond the controllable I/O of the machines and establishes the entire space in which the machine operates. To communicate intention to the machines, "Skills" are defined and presented to represent functions of the units based on the kinds of work products the units produce and how the work products are transformed. Finally, concepts of labelling, search, and reasoning are employed by the skills to cause machines to perform their duty.

Examples of some methods according to the present disclosure are applied to use cases to show their effectiveness. One use case includes machine tending and packaging. During machine tending, a flexible device is used to automate another machine that would typically be tended by a human operator. For packaging, multiple items may be brought together for sorting into containers. The objects may then be wrapped or otherwise processed further. It will be shown that Engineering with Reusable Skills makes the job for the application engineer clear and efficient.

First, definitions for some terms used throughout this description will now be provided. The term "skill" is used throughout this disclosure. The meaning of the term skill may be distinguished from the use of this term in other contexts which previously assigned the term skill a wholly different meaning. For autonomous engineering with reusable skills, the skills are used to program machinery, but they are not intended to be used as a programming language per se. According to embodiments of this disclosure, skills are to programming as computer aided drafting (CAD) is to technical drawing. Skills form a higher-level abstraction or representation of what a machine can do and what the machine should be doing. In this way, skills are distinguished from behaviors, which generally describe functional semantics.

For the purposes of this disclosure, the following terms will be used according to their associated definitions hereinbelow.

Skill—A skill defines the transformation of material into work products. A skill is machine independent in the sense that the objective is to achieve the transformation and the method of achieving the objective is optional.

Behavior—A behavior is an activity that machines, work products, and other entities in the system perform. A robot may move its joints, for example. A behavior is machine specific and can be applied to a multitude of tasks.

In today's automation programming practice, much existing code is written using functions representing behavior. That is, there are I/O and function blocks that represent an action causing a machine to affect a certain movement or sense a particular value. It is usually the automation programmer's responsibility to write code manually for describing how those behaviors are composed together to make the devices do useful work. An example of a skill programming according to aspects of this disclosure may be executing CNC code to mill a product. The execution of the CNC has semantic meaning applied to the product being manipulated. It's a path in space for moving a cutting tool, for example. The same CNC code can be run on different configurations of machines and achieve a similar effect because the semantics do not apply to how the machine is set up. One could have the same CNC done by a gantry-like mechanism or a robot arm-like device.

It is proposed herein to engineer skills using an object framework where a user picks and configures objects representing the different aspects of the automation system being built and assembles them together to make them work. This type of architecture makes skill engineering more like picking out the parts of the intended system rather than having to compose and write long sequences of coding instructions. Most objects supported by the system are already familiar to the engineers. Objects represent the devices such as robots, grippers, and sensors. It is further proposed that objects are defined to represent all items in the world. These items include work products, carriers, and any other automation element whether it is electronically active or not. Just as in a simulation tool, the objects being affected by a process are just as important as the objects doing the work.

The behaviors of the automation system are manifested in the objects of the world objects such as the devices performing the actions and the products being acted upon. Thus, behaviors are not really objects in themselves. The devices and products are objects and the behaviors characterize what they do. In digital form, a behavior is represented by simulation of the device activity. In the physical world, the real device actually does the behavior.

The objects representing skills are intended to be used for high-level actions. For a manipulation activity, a skill might be "put an object at some location". For an assembly task, the skill might be, "take two work projects and join them together in a given configuration". A skill is parameterized by using other objects in the world model such as a robot or the work pieces to be assembled. A skill and its parameters form an interface to the outside that makes it convenient to apply and to apply skills consecutively to achieve the final product. It is amenable to search, simulation, and optimization.

The following criteria can be considered for defining a machine to be autonomous:

1. The system understands itself, its environment, and its context. By explicitly representing the objects within the environment and keeping properties of the objects up to date, the autonomous system may reason about its state and how to achieve its objectives.

2. The system may be directed in goal-specific terms. By supplying skills, tasks are described at a higher level than I/O values or device states. The objective of the task may be represented by configurations and references to the world objects in the environment. How the actual work is performed need not be detailed provided the machine can determine how to do it for itself.

3. The system is resilient to unexpected events. Because the robot knows the high-level objective and the state of its environment, it can determine new actions based on that state rather than following a fixed set of instructions. Skills are implemented by searching the environment for actions to perform and the structure of objects in the environment describes how to accomplish the task.

FIG. 1 is a block diagram showing a machine tending use case according to aspects of an exemplary embodiment. According to this use case, the desire is to enable flexible and efficient configuration and programming of a mobile manipulator 101 that will be used with a CNC machine 103 for machine tending 105. The main objective of this use case is to demonstrate that a system can be created that enables an application engineer to efficiently configure the locations of storage, supply, and production areas as well as the involved machines and their required skills. In particular, it should be easy to configure the mobile manipulator 101 to tend multiple machines and the system as a whole should be able to manipulate and transport a variety of different materials 110 and products 120. Finally, the machines should be derived making use of product lifecycle management (PLM) data (e.g., part models) for much of their content.

The machine tending use case demonstrates benefits of described methods on several dimensions. Increased flexibility is provided by enabling the reconfiguration of production systems, whereby shop floors may be adapted flexibly to changing manufacturing processes or when new products are introduced. In the machine tending use case of FIG. 1, this benefit is demonstrated by the system's ability to handle a variety of different materials 110 and products 120.

Reduced operational cost and shorter time to market is provided by enabling the efficient and straightforward reconfiguration of production systems, whereby tooling times are reduced, which is particularly important as mass customization leads to ever smaller lot sizes. In the machine tending use case of FIG. 1, this benefit is demonstrated by the enabling of system integrators to rapidly reconfigure the machine tending system.

Reduced investment is another benefit. Straightforward reconfiguration of production systems reduces the amount of underutilized capacity of existing production resources, thereby strengthening a production facility's return on invested capital (ROIC). In the machine tending use case of FIG. 1, this benefit is demonstrated by this system simplifying the use of a single mobile manipulator 101 to tend multiple machines 103, thus requiring fewer mobile manipulation platforms overall.

An approach to autonomous engineering with reusable skills and its system has a primary end to provide new methods for engineering support systems such as the Robot Operating System (ROS) and other existing methods.

Figure 2:
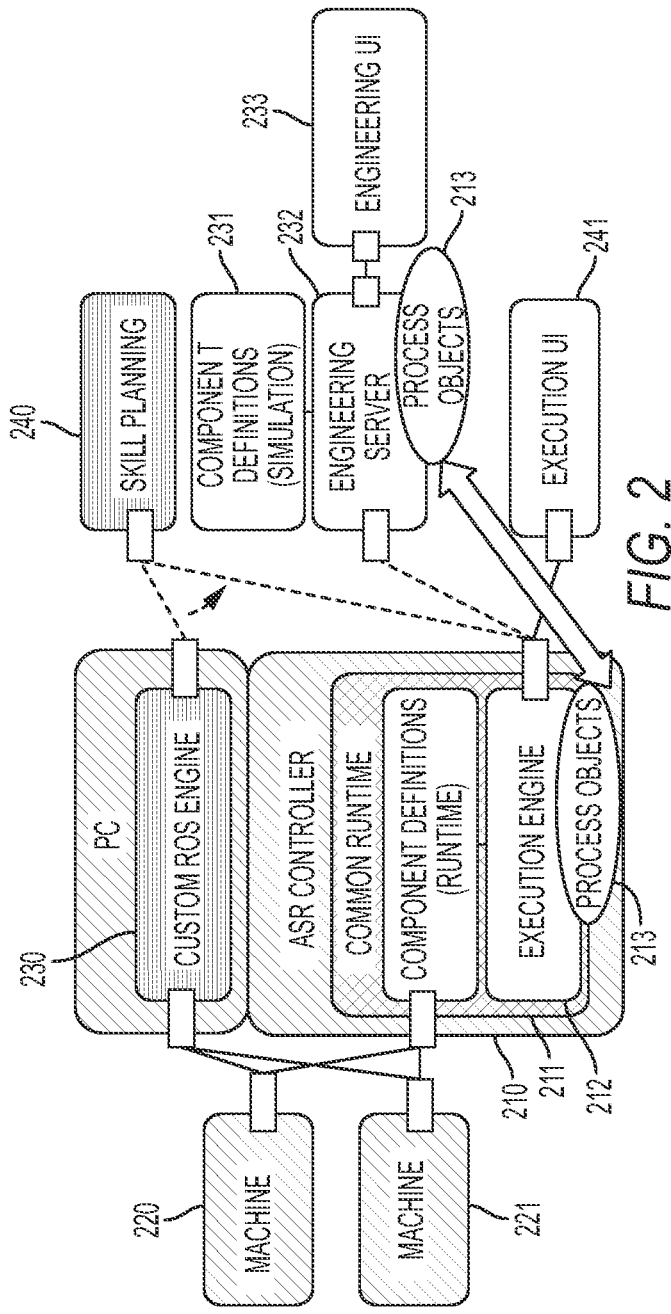
FIG. 2 is a block diagram of an autonomous system using reusable skills according to embodiments of the present disclosure.

FIG. 2 is a block diagram of an exemplary architecture for an autonomous engineering system according to aspects of embodiments of the present disclosure. An autonomous systems revolution (ASR) Controller 210 is shown separately from the machines 220, 221 because it holds the ASR Runtime 211. In principle, the target machines 220, 221 could host the runtime but for the purposes of this illustration implementation will be limited to the system's multi-platform controllers. The ASR Controller 210 could be any device capable of running the ASR Runtime 211 specifications, such as a Linux-based network router by way of example. The runtime 211 contains application programming interfaces (APIs) for accessing the target machines 220, 221 that provide, for instance, TCP/IP or Digital I/O capability.

A custom robot operating system (ROS) engine 230 may be implemented as part of a separate control path to the target machines 220, 221. It should be expected that the same machines could also be controlled by the runtime 211 (though not necessarily at the same time). The ROS engine 230 defines an interface for the discovery and execution of skills and interacts with software for skill planning 240. This automatic planner will eventually switch to use world model objects for skills and the execution engine 212 for executing planned processes.

Other major components include the engineering tool 230, runtime execution of engineering applications, and design of the programming model itself. The product of the engineering are the process objects 213. These process objects 213 are effectively the code that both specifies the world model as well as the logical semantics that govern the application's function. The process objects 213 are shown as being the same in both the engineering 230 where they are specified and in the runtime 211 where they are executed.

Component definitions 231 that define world model objects for the targeted process (e.g. machine models, work products, and skills) form the basis of this approach. These definitions 231 are loaded by the engineering server 232 at engineering time and by the execution engine 212 in the runtime 211. The component definitions 231 provide the true implementation that connects the logical behavior of the application to the real machines 220, 221 that perform that behavior. During engineering, the machine behavior may be replaced with simulation. An application engineer uses an engineering user interface 233 to create, view, and edit engineered processes and can rely on the engineering server 232 to simulate the behavior of engineered processes.

These processes are downloaded to the runtime 211 and executed by the execution engine 212. The engine 212 would be implemented as a plug-in to the common runtime 211 and communicates with concrete machines (e.g., robots, conveyors, CNC machines) via machine behaviors that are defined in component definitions 231 referenced by the engineered processes. The behaviors themselves are typically executed using the machines' native controller interface. Finally, an execution user interface 241 is used to track the execution of engineered processes in real time. This interface 241 visualizes the process execution progress and the current system state, and also gives an operator basic controls over the execution of the process (e.g., pause/resume/stop).

In order to compete in global markets, factories of tomorrow need complete production lines, including automation technologies that can effortlessly be reconfigured or repurposed when the need arises. Similarly, one main objective in the context of the Internet of Things (IoT) is to empower users by giving them the ability to "program" (and re-program) everyday things and create new functionality on top of smart devices and the services they provide. However, enabling users to combine services remains a big and heavily researched problem. In fact, it is one of the central challenges in the domain of End-User Programming. Also, in a narrower context, industrial robots can be notoriously difficult to program leading to high changeover times when new products are introduced by manufacturers. Current research focuses on the development of easy-to-use and affordable robot programming tools. In the future, application engineers are widely expected to merely assist programming robots, without requiring expertise in robotics. Finally, another currently heavily researched alternative is to attempt and take the human engineer out of the loop completely, by enabling the automatic configuration and composition of basic generic machine skills.

Providing users with the tools to program their smart environment has been identified as an important challenge for ubiquitous computing research, in particular the smart home domain, but the same is true for smart factories, where the easy (re)configuration of manufacturing environments is gaining importance and operators must be supported in managing the implied added dynamicity. Many of the service composition systems that are presented in the literature and widely used in industry feature a process-driven paradigm: they support end users (i.e., process designers) in composing service mashups using a domain-specific language or an abstract model of the composite service, or using visual tools based on graphs or service stacks. This is true for many well-known systems in industry (e.g., IBM Business Process Manager, Oracle BPEL Process Manager, Microsoft BizTalk, and SAP NetWeaver), open source solutions that address business process modeling and execution (e.g., Apache ODE and JBoss jBPM), and research prototypes (e.g., eFlow). In the IoT space, similar systems—referred to as "Mashup Tools" exist, for instance Yahoo! Pipes, the Google Mashup Editor, and IBM Mashup Center. A very popular service for creating simple two-stage service mashups that recently expanded to also let users create more complex "Recipes" is If This Then That (IFTTT) that contains hundreds of elementary services provided by devices (e.g., thermostats, garage doors, etc.) and programs (e.g., Dropbox, Google Calendar, etc.) and is very quick to take up novel services and devices that can be used in compositions.

The concept of skills is a commonly used abstraction for the capabilities of a system. However, since words such as "skill" and "behavior" are common, different researchers will use different definitions for the same terms (often within the same field). While skill definitions differ mostly on the granularity level and parameterization, they usually have their common origin in the notion of the composition of tasks from atomic system functionality (or, vice versa, in hierarchical task decomposition).

The objective of this abstraction is to expose a higher-level programming interface that hides the complexity of the underlying low-level system instructions and thereby leads to a better separation between control and process logic. One may also use skills as the basis not only for unit control but also to provide more kinds of automatic reasoning involved in planning and optimization since formalizing machine operations as skills allows one to implement a principled way for a system to automatically reason and communicate intentions between units.

With the objective of engineering with robotic skills, some research has been performed that defines a "task" as a group of behaviors connected in a graph structure where each link in the graph represents a transition between one behavior and the next. Generic behaviors are wrapped in "task items" that include a list of preconditions that must be met before the task is executed, the name of a behavior (or other task) and parameter list for execution, and links to additional task items that are executed based on the return status of the currently executing behavior (typically, a binary success or failure). Complete tasks are composed of task items that are linked in a directed acyclic graph—graphs can also contain sub-tasks, allowing for more complex hierarchical task structures. For modeling skills and behaviors, a similar abstraction has been employed where the basic capabilities of devices are captured as "motion primitives" and composed into task sequences as generic or application-oriented skills. Another system models skills as functional blocks that take a system state and parameters as input and produces a modified system state as output.

To make modeled skills and behaviors useful in industry deployments, abilities must be provided that allow their efficient and intuitive composition to executable tasks. For robotic systems, programming is traditionally done using Programming by Demonstration (PbD) frameworks that use a variety of sensors (e.g., voice, vision, touch, motion capture, etc.) and virtual demonstration environments. Many of the physical sensor-based systems however fail to achieve the robustness and accuracy levels that are required in industrial deployments and virtual demonstration has been described by researchers and operators, as both time consuming and inconvenient, for robot programming tasks. Building on the behavior and skill models described earlier, novel systems for programming industrial devices (including robots) aim to overcome these challenges by transforming the task of programming machines into one of constructing executable code out of simpler building blocks.

Enabling people to intuitively and efficiently compose basic behaviors into useful applications (these are commonly referred to as "mashups" in the IoT domain) is at the heart of the research domain of End-User Programming. In this context, many current mashup editors from academia and almost all prominent tools used for service composition in business environments feature visual composition interfaces to make them usable by mashup designers without programming or scripting skills. Visual programming abstractions have also been applied in the context of facilitating the configuration of smart environments for end users in home automation scenarios by stacking blocks that represent individual services or connecting pictures of smart objects to describe the desired composite functionality. Some studies included user evaluations and conclude that all of the participants familiarized themselves quickly (i.e., within a few minutes) with the concepts and were able to create applications for themselves with only negligible prior training. A commercial platform that enables users to create composite services in the home automation domain is Ninja which, similarly to IFTTT, can incorporate many commercial platforms. Specifically, for the IoT, IBM has proposed the Node-RED system as a tool for wiring IoT services; a similar system from academia called ClickScript has been extended to handle smart things and their services in the IoT context and it is very straightforward to adapt this system to further use cases.

At the moment, skill engineering in the industrial domain focuses on programming robotic devices. For instance, voice commands have been used to assemble simple robot behaviors by iteratively constructing tasks through a dialog between a human instructor and a robot. During composition, researchers distinguish between skill sequencing phase and a teaching phase. Sequencing is performed using a touch-based GUI on a tablet in which the operator selects skills from a skills library to create a skill sequence that matches the operations in the task at hand. Next, the operator parameterizes the generic skills in the skill sequence during the teaching phase. Other research discusses kinesthetic teaching (piloting the robot arm to target locations by pushing the end-effector) and gesture-based teaching (based on a set of abstract manipulation skills with only a single parameter as input). It was concluded from a user study that the skill-based programming approach does in fact enable non-experts to intuitively program industrial relevant tasks in an acceptable amount of time: no user needed longer than 15 minutes for sequencing and teaching basic machine tending tasks (exchange of two objects at two locations: a box is filled with parts and needs to be exchanged with an empty one). Furthermore, the sequencing step was immediately intuitive for all participants, indicating that the skills themselves are intuitive, and users generally preferred gesture-based teaching because of the skill abstractions and simpler parameter matching.

One can learn a great deal about usability from the study of end-user programming and the design of tools intended for non-programmers. For industrial machinery, though, the stakes are greater than the consequences of programming your home's lamps to follow one around the house. The design of industrial smart components such as a robot is significantly more complex than a home thermostat. The principles, though, can be quite similar. Encapsulation of a complex device into a higher-level abstract representation of that device's functions makes sense. It also makes sense to represent devices in a manner that speaks to the semantics of that device rather than translating to a common programming API.

Current IoT standards are not compatible and are not intended for industry. As a result, the amount one can program a given set of devices is severely limited. It is also difficult to bring new devices into the standard. Part of the objective of developing skill-based engineering will be to define not only how the devices are programmed but also the runtime representation of devices in such a way as it can be deployed with confidence on a factory floor.

Programming with skills is mainly an amalgam of two concepts. First, one represents the devices and products employed in the application as a kind of world model derived from a library of components. In current practice, programmers hand-write custom data structures and algorithms to represent program state. Second, the functions and tasks that the devices perform are encapsulated into high-level abstraction objects that are assembled together (along with the other world model objects) to achieve a working solution. In the usual practice, code is written as a kind of mathematical set of logical expressions that is usually wholly separate from the world model and must be compiled to run. The intuition is that when writing a program to achieve a physical result, the organization of that physicality is the key ingredient in that application and much of that organization can be realized by re-using a standard set of building blocks rather than writing code from scratch.

As a general rule, it is easier to know what you want but much less easy to know how to achieve that objective. A traditional programming language requires the programmer to describe an algorithm using terms that are much more fundamentally simple than the problem that one is trying to solve. There is no obvious relationship, for example, between the need to express an iteration loop using a "for" statement and the need to find all the boxes in the storehouse and make a pile. A "for-loop" is a low-level, mathematical concept; whereas, fetching boxes is a high-level, human concept. Though a system according to this disclosure may not entirely solve the AI problem to program robots that know how to transport boxes intuitively, one objective is to push the programming problem up the abstraction levels so that less needs to be specified to achieve a greater result.

In typical programming, to increase the level of abstraction, one creates reusable libraries. A library, though written in a particular language, expresses concepts in a different meta-model. By applying the concepts in the meta-model, a programmer can create using the library's higher-level abstractions and build the application more efficiently. One can achieve even higher levels of abstraction using domain specific languages with associated editors. Consider an editor for creating production system simulations like Process Simulate. In the editor of Process Simulate, one loads entities such as the robot and moves them on the screen using direct manipulation and property dialogs. That the user is programming a simulation of the production process can be entirely lost from the user's perspective because one can see the 3D graphical depictions of the devices in use.

For the programming with skills concept, it is helpful to start from the standpoint of graphical editing—like in Process Simulate and build on top. Programmers generally know what they want the device to do and the attributes of how the job should be accomplished but are less likely to know how to accomplish the task or know how various implementation choices will interact with each other. So, a large part of the programmer's task should be selecting and arranging the elements of the application in much the same way as performed in a simulation tool.

Figure 3:
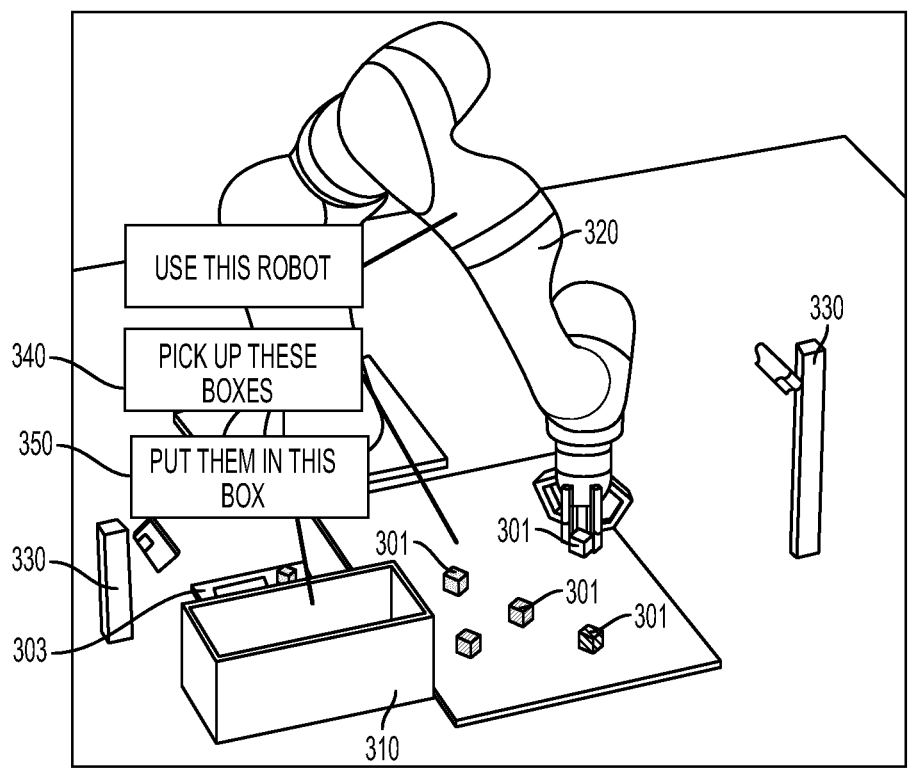
FIG. 3 is an illustration of a robot, identifying high-level objective-oriented language to specify an application function according to embodiments of the present disclosure.

For example, in FIG. 3, the programmer might want to pick up a set of objects 301 and sort them into bins 310. The "program" for this application would consist of the robot 320, cameras 330, and any other active device. Plus, it would contain the passive objects like the work pieces 301, jigs 303, and containers 310. Further, one would want the activity to be specified just as generically as denoted in the figure. It would be as close as possible to just "pick up these boxes 340" and "put them in this box" 350. The majority of the actual programming in this case would be determining the correct selection of objects to affect.

Traditional programs use hand-crafted, low-fidelity representations of the environment in which they operate. The programmer is entirely responsible for drafting the data structures that represent the world of the devices and all the state that is needed internally to make the device operate. They are also responsible for writing code for each action and conditional test that the application program performs in detail. As a consequence, the world representation and program code are written as minimally as possible, both because time is precious and to reduce the amount of code that needs to be tested. This prevents algorithms from reading the world state in a general way and is generally an impediment to creating autonomous systems.

By enabling application programming at a higher level of abstraction, we are likewise creating a new kind of engineer. A traditional engineer would be a machine builder or an integrator and would be familiar with concepts like I/O and programmable logic controller (PLC) programming and how to program using basic logic such as Relay-Ladder-Logic (RLL). Programming with autonomous machines enables a new class of Application Engineer who may not know how to in program low-level languages or build circuits, but instead understands how to assemble a suite of machines to accomplish production tasks and knows what those machines can do to be able to orchestrate them to work together. One could think of an application engineer as more of a machine manager rather than a machine builder.

A more apropos comparison might be programming in the video game industry. In the past, small teams of programmers would build a new video game cabinet like Space Invaders from scratch, assembling chips with monitors and speakers to make the game work. Later, PC games would be programmed using graphics libraries in higher-level languages like C++. More recently, large teams of game designers build a game as though it were a movie production. The number of experts who program the game's "engine" is still small and they work in C++. However, there are a whole new class of game programmers called "level designers" who use high-level editors to assemble the game's world and interactions. It is the level designers as much as the engine programmers who make will make a game actually fun to play.

Figure 4:
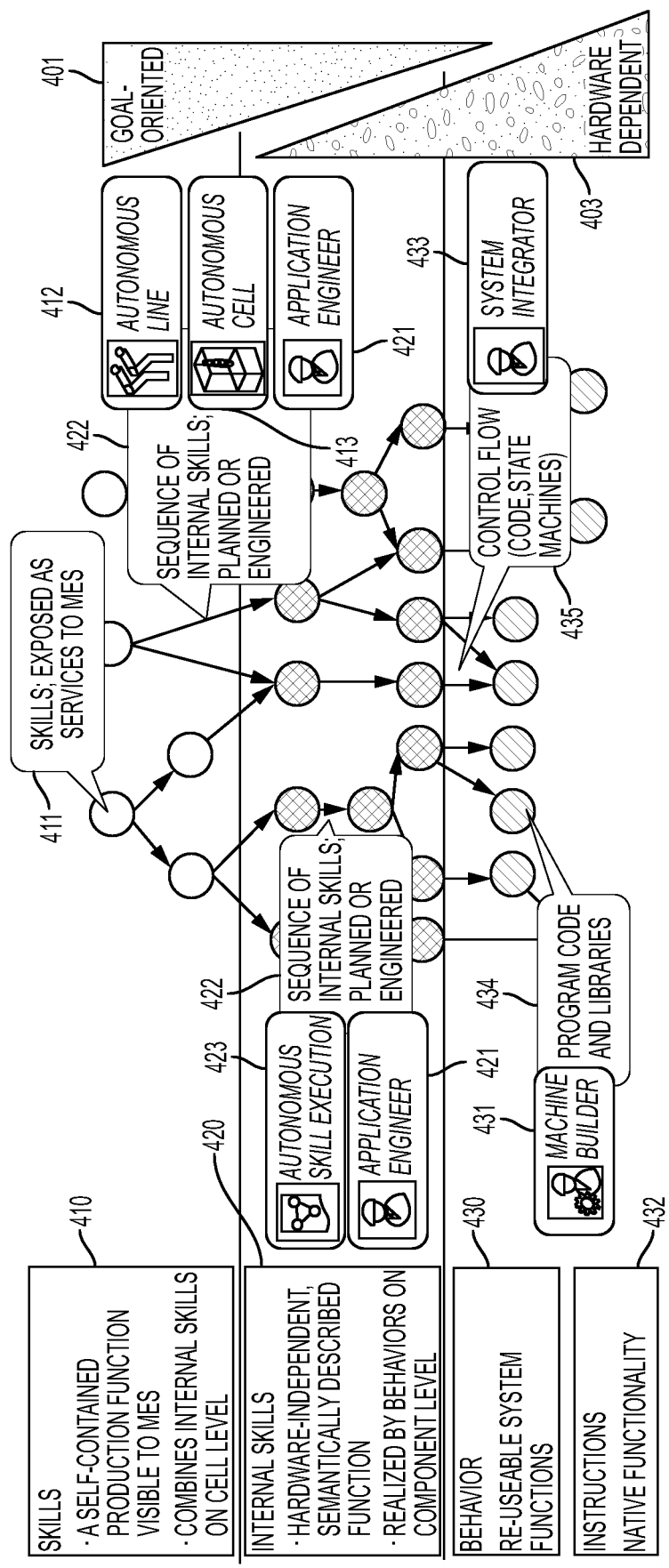
FIG. 4 is a hierarchical diagram illustrating abstractions in application programming according to embodiments of the present disclosure.

A new hierarchy of programming semantics is shown in FIG. 4. As shown on the right, the top-most coding elements are intended to express the application semantics according to what it does for the production. The "objectives" of the production 401 are the operations and transformation that occur to the work pieces regardless of the device that carries it out. At the bottom are the devices themselves that are necessarily hardware-dependent 403. From an application perspective, the device could be used for many purposes and the objective could be achieved by a multitude of hardware.

The functions of these different abstraction levels are given the names "skill" 410 for the high level and "behavior" 430 at the low level. A robot has the behavior, for example, that it can move at the joints to make its end effector shift position to different places. Likewise, an application could have a skill for assembling car seats. The skill of assembling car seats can be very complex, there are lots of different kinds of seats as well as fastening mechanisms for attaching them to a chassis. So, a skill will have complex parameters to describe these different alternatives. But assembling a car seat is not a behavior because there are many possible machines that could be used to achieve that task.

The machine builder 431 has the role of building the machines and programming their behavior for example, through program code or libraries 434. Behavior is specified using instructions 432 just as one might program a machine traditionally. The machine building role is only modified in the sense that the devices and behaviors need to be made available to the application engineers 421 at the higher level. We also consider the system integrator 433 who would have the role to decide on interfacing factors 435 between the machine components and the skills. This would reflect what kinds of behaviors a machine should have and how one would access and control them.

The application engineer 421 has the role of building the skills that themselves can be constructed from internal skills 420. In principle, there is no difference between skills 410 and internal skills 420. It is simply the case that skills 410 may also be accessed externally such as from the MES system 411. Accordingly, the application engineer 421 may build skills that are constructed from skills 410 or internal skills 420. For example, the application engineer 421 may access higher level skills pertaining to an autonomous line 412 or autonomous cell 413. Internal skills 420 are used to implement other skills 422, but in themselves are just too implementation specific to be useful as a machine interface.

As previously mentioned, the first key to being autonomous is for the system to have knowledge about its environment. This knowledge must not only contain models of the devices that are actively controlled or provide sensor values, but also all the passive objects as well as active objects that may enter the environment but are not controlled by the unit. We will call these objects a subset of the "World Model Objects" because they constitute a part of the unit's world. World objects are the means for representation and interlocution between the functional elements of the application. They are also the essential means to define the behavior of the application. The use of World Model Objects allows for the system to autonomously execute one or more skills 423 to execute the behaviors of the system. We will also introduce more kinds of objects into this world model in upcoming sections.

Figure 5:
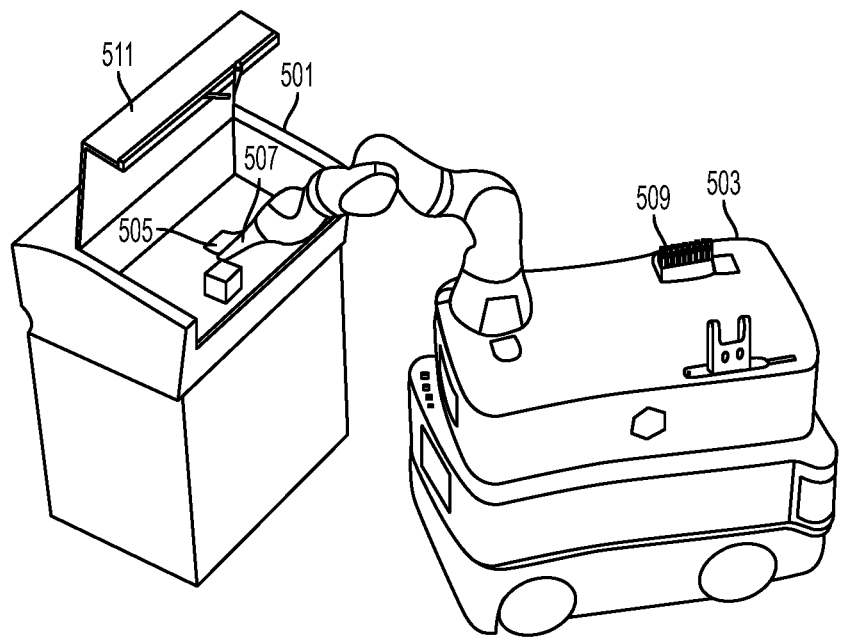
FIG. 5 is an illustration of a machine tending use case according to embodiments of the present disclosure.

An example use case is shown in FIG. 5. Here we have a machine, in this case a laser engraving device 501, being tended by a mobile robot 503. The robot in this example picks up a work piece 505 and brings it to the laser engraver 501, the work piece 503 looks like a small gray box in the figure being held by the gripper 507. The robot 503 takes the work piece 507 off of a conveyor (not shown), sets it into a jig 509 for transport, opens up the laser engraver's lid 511, inserts the work piece 505 into the laser engraver 501, and the process continues.

Figure 6:
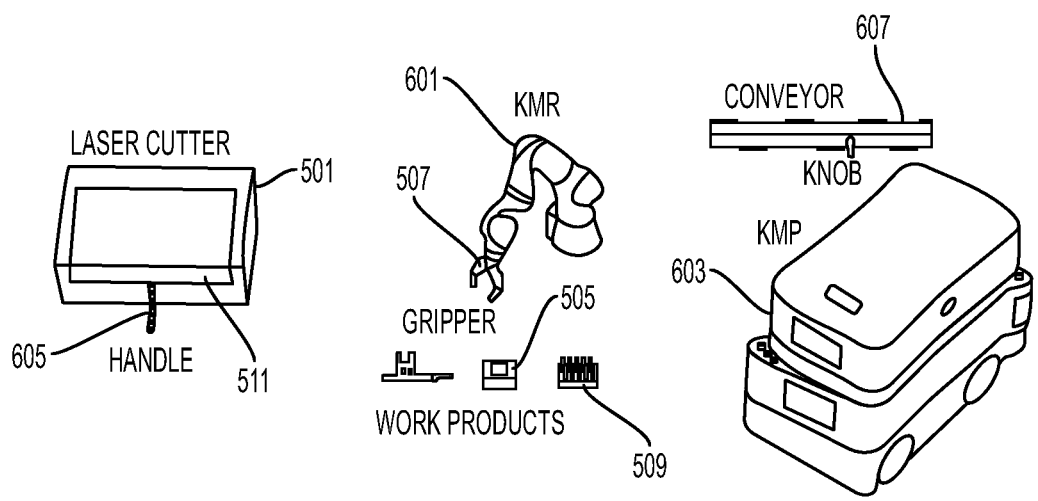
FIG. 6 is an illustration of a breakdown of the system shown in FIG. 5, indicating individual objects comprising the machine tending unit according to embodiments of the present disclosure.

A breakdown of the physical world objects being used in such a unit is shown in FIG. 6. World objects are created to represent the physical as well as the semantic and functional aspects of the application. It is rare for a world object to be purely physical or logical. A robot, for example like the KMR 601, is both a physical object and it moves around under programmatic control. This is further true of the robot transport KMP 603 and conveyor 607. This movement is likewise both physical and logical, the other parts of the unit's application may look to see the current pose of the robot 601 in order to decide the execution of its own behavior. Even a simple object, like the work piece 505 that looks like a little box is both physical and logical. The presence of a work piece 505 is a logical element of the application, it is there so that the unit performs work and as such it acts like a switch. The work piece's size can dictate the size of opening for the grasping device 507 and its angle and position determine how it can be moved. Units may be nested in scope, for example laser cutter 501 may include the laser cutter lid 511. Likewise, a handle 605 attached to the cutter lid 511 is part of the cutter lid 511 as well as the laser cutter machine 501.

An application created using the engineering techniques described in this disclosure are intended for programming of Cyber-Physical Production Units (CPPU or just units). The scope of a unit cannot be stated precisely as it depends greatly on the application and the impression of the application engineer. In general, a unit provides a set of services consistent with a tightly related group of machines. A gripper attached to a robot is almost always considered part of the same unit. However, whether or not two robots are part of the same unit depends on the task. If the two robots work together on the same work product, then they might best be considered part of the same unit. Two robots working independently might be better as separate units. A camera system sensing the location of work parts may be shared across the entire shop floor. As such, it might be considered a unit unto itself or it may be considered a shared sub-unit across other processing units.

Figure 7:
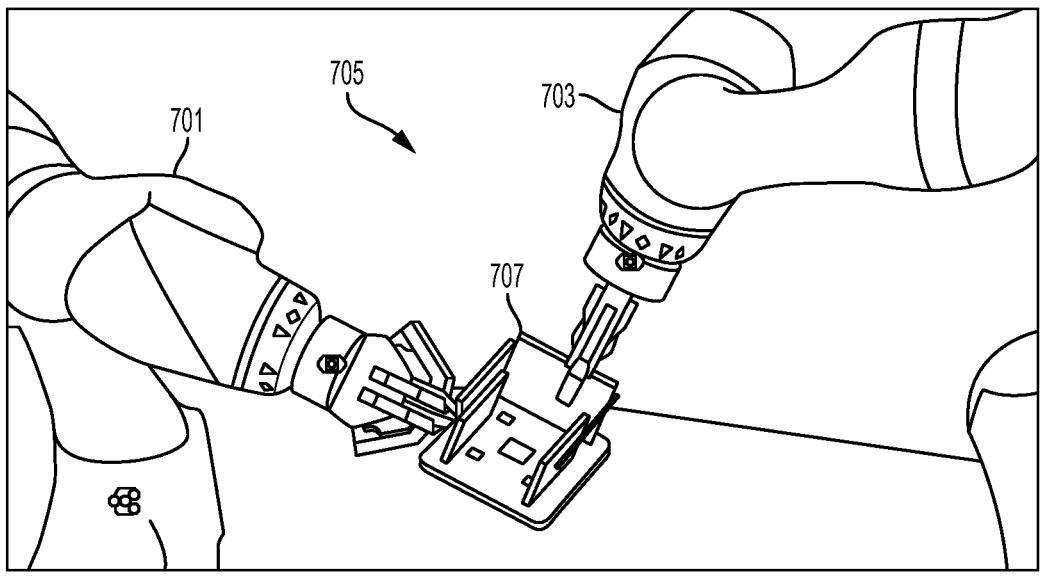
FIG. 7 is an illustration of scope of an object, using two robot grippers as a unit to perform a task according to embodiments of the present disclosure.

With reference to FIG. 7, the scope of a unit within the world model can change depending on the task. A robot 701 may be regularly used as an individual unit but for some special task, such as carrying a large object, it may recruit a second robot 703 to help left the heavy item. The robot 701 running individually would form one unit when it is being applied to its usual tasks. The second helper robot 703 would likewise be its own unit when working in that mode. To perform the combined task, the two individual units may temporarily form a combined third unit 705. While the combined task is in progress, the individual units 701, 703, though still present, would be inactive and have to wait until the combined unit 705 has completed its task before re-activating to start performing the individual tasks again.

The scope of a unit is also not one-to-one with controllers. A single unit may be implemented in a distributed fashion over several controllers and multiple units might implemented within a single controller and any other combination. For example, a camera system may require its own processing unit to handle the computational load for recognizing objects. Intelligent components like robots and conveyors will commonly use their own processors and controllers.

Since there is no strong relationship between units, devices, and controllers, the unit concept is treated more as a logical interface for skill services rather than access to anything physical. A unit is associated with the services it can contribute as designated by skills the unit exposes to the outside world. For example, one unit may provide a service that requires only one robot 701 to accomplish—like moving a workpiece from a conveyor to a holding bin. A separate unit may involve that same robot 701 and another robot 703 to perform a combined assembly skill such as the insertion of a work piece 707 into a container as shown in FIG. 7.

Figure 8:
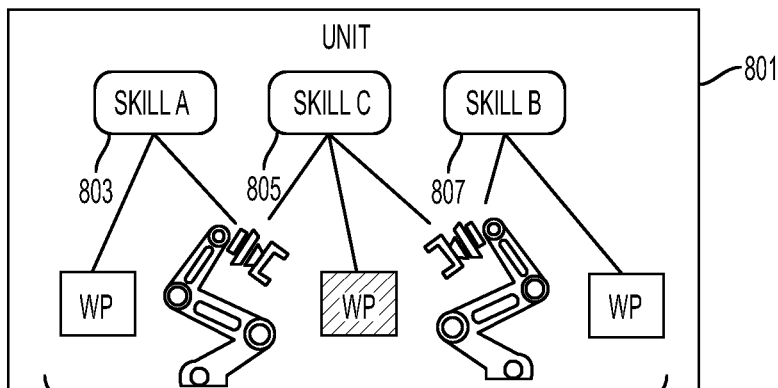
FIG. 8 is a hierarchical representation of a unit with a strict relationship to its associated objects according to embodiments of the present disclosure.
Figure 9:
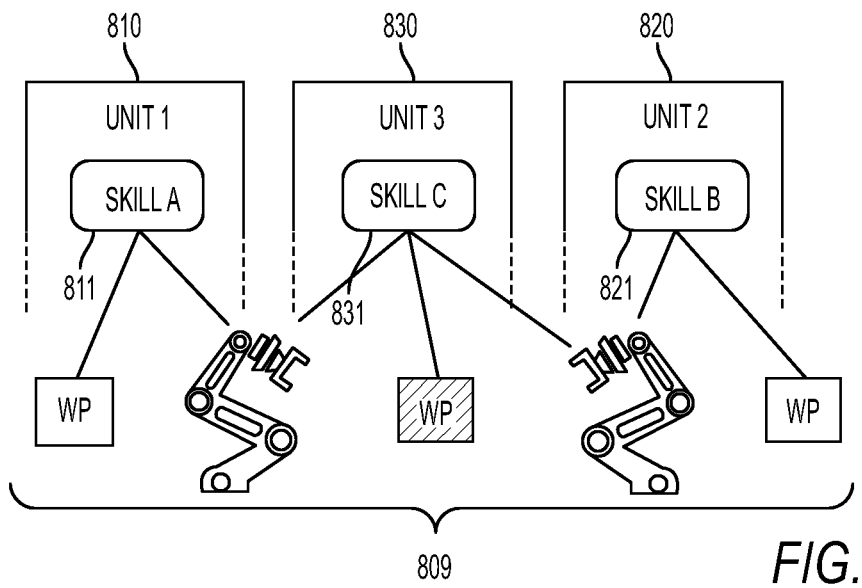
FIG. 9 is a hierarchical representation of multiple units using different configurations of shared objects according to embodiments of the present disclosure.

FIG. 8 and FIG. 9 are block diagrams showing the relationship and scope of one or more unit designations according to embodiments of this disclosure. If one enforces a strict relationship where a given device can only belong to one unit, then it must be the case that any skill that combines the resources of multiple devices must require those devices to be part of the same unit. This kind of situation is shown in FIG. 8. A single unit 801 is provided that includes three skills 803, 805 and 807. The skills 803, 805, 807 may be associated with one or more physical objects 809 including robots and work pieces. However, production systems are rarely created from green field and historically, devices might have been already separated across multiple units by a prior application engineer as shown in FIG. 9. Units 810, 820 and 830 are defined separately and contain skills 811, 821 and 831, respectively. This should not prohibit a new configuration of devices 809 to be used when it is recognized that a useful skill can be produced by that combination. As such it should be possible to seamlessly impose a new unit with new skills onto an existing set of devices without removing or re-writing the code of the original units. Having multiple units share devices is shown in FIG. 9.

A model can only include so much detail until it becomes unreasonable to be used for anything. The purpose for the model needs to be understood and considered when designing world model objects to be used in engineering. The first thing to recognize is that the purpose is to program production machines and not to simulate a machine or even to design a machine. What matters is the production itself and not the particular inner workings of the device. Such concerns can be left to other engineering tools.

The detail of the model cannot be physically perfect, nor does it need to be perfect. The model need only be sufficiently detailed to handle situations at the level of abstraction of the unit. For example, the mobile platform device shown in FIG. 5 needs to be sufficiently detailed to be able to move around because its movement directly affects its function for the unit. Effectively, that is what the unit does. But the internal workings of the mobile platform such as its circuit boards or its, however many, nuts and bolts it contains need not be modeled. The operation of the unit in no way disassembles the mobile platform so knowing what is on the inside would be too much detail.

It is expected that the set of components created in the component libraries will be based on the needs of the application engineer and will be created at the correct level of detail. The reuse of components will favor those that serve a purpose and new components will be created as necessary. Using components that are created for other purposes such as simulation models is possible but should not be expected to yield too many results. Simulations are usually created for specific purposes, are computed at a slow time frame (like hours to compute a minute's activity), or address particular, specialized behavior of the device (like how much it vibrates). It is more reasonable to take existing data, carve out the unneeded parts, and add back in what is missing by hand.

Product Lifecycle Management (PLM) is the set of techniques, tools, and practices that one undertakes to design and produce some kind of product. The product may be relatively simple, like a plastic cup; or, it can be incredibly complex, like a cruise ship. Obviously, the kinds of tools and techniques one would apply to such different endeavors are likewise quite different. There is a desire that the data sets and tools that one employs in PLM could somehow be leveraged to not only describe the product but also to program the machines that make the product. For many point cases, this is possible. For example, today's CAD systems can usually design a suitable CNC program to cut a part using a standard CNC machine. However, for the majority of situations there is still a great deal of information missing. The kinds of engineering data and systems suggested by this disclosure may be expected to further augment PLM data such that more can be done to make manufacturing more automatic.

As mentioned above, the odds of simply finding the kind of data one needs to make world objects is fairly low with the presumption that current engineering practices are being used. For example, just because a plastic product uses an extrusion process in its forming does not mean that there are layout and functions of an extruder machine built into the product's PLM data. In general, PLM data consists of specialized formats generated by tools that are typically incompatible. The PLM data for a machine may include its CAD geometry, its wiring diagram, and its PLC source code. For a human, examining the data, one may infer how the device works. For a machine, these are separate data sources with little overlap and the majority of its function is implied but not stated.

By way of example, an obvious kind of PLM data that might be scavenged is 3D geometry. Having the correct 3D shape for a device is useful for display, programming, and simulation of the device. Clearly, tools for creating 3D CAD exist, but frequently, machine builders use 2D CAD. The objective of the machine builder is to create blueprints for their device that they can hand off to machinists and parts suppliers that actually build it. For this task, 2D CAD is well understood and a time-honored element of many manufacturers' toolchains.

If it is assumed that the manufacturers do supply 3D CAD geometry, there are still aspects of granularity and detail to consider. 3D CAD uses geometric primitives (polygons a.k.a. triangles) to render even the tiniest details like air vents and screw holes. This level of detail causes a geometric shape that might be rendered in a few hundred polygons to become split into millions of polygons. Even assuming Moore's Law will somehow make graphics cards fast enough to render this much unnecessary complexity, the sheer inefficiency limits the size of problem that can be handled. Instead of drawing just one machine with millions of polygons, it is much more useful to be able to draw hundreds of machines with more efficiently chosen polycounts.

There are several methods one can employ to reduce 3D geometric complexity in CAD. However, these are not automatic and rely on a skilled graphics specialist to employ properly. Among these methods are mesh decimation, texture mapping, and spline approximation. In mesh decimation, the polygons in the mesh are joined in places with low curvature to make fewer overall polygons in the mesh. Topological changes such as removing holes is still a problem with these methods. Texture mapping is the method employed in video games to create realistic graphics. There are many variants of texture mapping including Bidirectional Reflectance Distribution Functions (BRDF), normal maps, and multi-dimensional textures that games designers use to enhance realism. The fundamental principle, though, is to replace geometry with images. For example, instead of representing holes forming a grating as actual holes, a picture of holes may be drawn in the same place. This uses significantly fewer polygons and optimizes graphics processors to draw image maps quickly. For spline approximation, the idea is to find a polynomial function to represent the polygons in the surface. This is a kind of curve fitting operation. Once a curve is found, the number of polygons can be adjusted by creating a new rendering for the curve. A circle that was originally drawn with 512 segments can be reduced to a circle with 12 segments. This process has similar problems as mesh decimation with topology.

One of the insights that is being discovered while designing an engineering system for autonomous systems is that there is no clear separation between the semantic understandings of the application symbolically from its physical representation. When one is labeling a semantic feature of an autonomous application, there are almost always physical properties involved. A door handle, for example, has a 3D presence, it located somewhere in space, the gripper needs to approach it a certain way to grab hold, etc. Normally, this physicality is directly encoded in the instructions used to carry out the application program. For example, a robot will be moved to location (1.2 m, 2.33 m, 0.22 m), basically some point in space. This point may happen to be the location of the door handle from the door that the robot wants to open. By putting the position in the instruction, rather that the representation of the door, the association between physical position and door opening is lost.

So, instead of coding semantic data into instructions, flip the process and encode the data into the world description. The instruction for opening a door will no longer encode the position of the door. Instead, it contains a path of references from a known object—the grounding object—into the structure of the world model until it finds the data it needs.

Labeling objects in the world object model may be addressed from more than one perspective.

For co-existing modeling objects, there are potentially different models for representing a similar concept that are used for different algorithms. For example, a simplified surface model for finding collision may be supplied that allows the algorithms that are too slow to handle complex surfaces to process the simplification in a time frame that can be used at runtime. However, both the collision surface and the visualization models are directly tied to the position of the robot's bodies. Being able to associate either or both kinds of shape model with a body object without having to change the definition of either kind of model or the body object itself lends a high degree of runtime versatility.

Further, the generic notion of attachment helps reduce the use of types of systems to encode data. Instead of creating a new subclass of an object to encode new data, simply attach the new data to an object via an appropriate attachment. Attachments form a basic kind of reference that can be easily searched. For example, one does not need a special form to consider a manipulator class that includes a robot and a gripper. The robot alone can stand in for the top-level object and the gripper becomes "attached" to the robot. This also helps reduce the number of helper classes and allows for partial configurations to arise naturally. If the particular configuration of objects does not exist, one does not make the attachment. It is perfectly feasible that a device contains a robot with no gripper or that one has a gripper but no robot.

In an embodiment, using a consistent representation is considered. To use a common model, various users must be able to access and contribute new data to the model without ruining the data for other users. A basic structure for representing the overall structure of a device such as its axes, moving parts, and shape can be shared. However, specific algorithm specific information also must be added without requiring a whole new data structure to be implemented. Formats that impose too much implicit knowledge into a data structure should be avoided. For example, a scene graph model for axes cannot represent a configuration with a kinematic loop. So, a better representation would use separate axis objects to represent connections. In cases where multiple representations are preferred, care must be taken to constrain one to the other so that modifications are correctly reflected in both structures. Defining constraints between structures or using property setting methods can serve to keep structures consistent.

In another embodiment, Position/Orientation/Shape is used as a first-class property. For a controlling a physical device, one would expect to see more of a physical representation in its logical structure. But typically, concepts of position and shape are boiled down into simpler data structures. For pick and place tasks, the advantage of representing positions explicitly is obvious because it is where the robot's manipulator goes. But the concepts of size, shape, position, and orientation can be used in more general and even subtle ways. For example, consider a representation of a drill hole. One might commonly state that the drill skill has parameters of depth and diameter, which are numerical entities. In an embodiment, an object may be created of the proper size and position for the hole (e.g., a cylinder shaped object) and the shape is used as the drilling skill parameter. While the number of parameters to specify a cylinder is the same as providing simply numerical entities, the knowledge and semantics of being a cylinder is lost by reducing the parameters to merely a list of numbers. One cannot scan the set of skills and see which ones support certain shapes. Also, the order and syntax of a list of numbers is arbitrary, which may muddle the programming with open items such as the following examples: Was the diameter accidently set to be the height? Is the desired shaped labeled in terms of the diameter of the hole, or the radius, or the drill bit size? On the other hand, a cylinder shape is explicitly parameterized in a known manner.

According to another embodiment, graphical semantic markers may be used as tags. The natural consequence of providing geometry as a direct programmable concept is that tagging becomes more obviously graphical and geometric. For example, work product positions in a carrier can be tagged with markers. Also, the positions of salient activity can be derived from low-level geometry itself. The resting position of a work part may become "wherever the part fits on the table." Visualizing the tags and their derived geometry is a trait of the editing environment as described herein. Using the semantic markers according to embodiments of this disclosure reduces cognitive load by hiding graphical tags that are not relevant to a given task.

The engineering objects that represent skills are effectively the same kinds of objects used to represent all other dynamic features in the engineering system. Just as one can represent an actuator in a robot arm that moves in a circular direction, one can represent a service the robot performs, like picking up an object. Of course, the context for a skill object is different from an actuator because it has a different role. Whereas an actuator might be considered "part of" the robot, a service like picking something up may be considered "attached to" the robot.

As discussed above, supporting easy access to skills, the "unit" is defined as a key object that contains all the service-level skills for that unit. This is useful to an application engineer wanting to support multiple configurations of units when applying different skills. For the simple case, where one controller is used to implement exactly one unit, the unit object is itself optional and one would query the controller itself for all service skills it provides.

It is possible to define the implementation of a skill using a variety of different techniques and languages. It will now be shown that a basic skill composition language based on imperative iterative flow and expression evaluation, like a flow chart, but other forms are also possible. For example, in game engines, a circuit-based constraint schema is often preferred. In principle the skill concept is language independent. The key features are representation of the application's world through objects, tagging of world objects with application specific information, and composition of skills to make executable services.

The execution of skills is based on investigating and walking through the labeled tag structures found in the world objects. Through expressions in skills, one is able to find tags related to a particular concept—like what object the robot is supposed to pick up—and how to parameterize the device's actions—like where the object to pick up is located. The objects themselves are also active. The properties of objects change to reflect updated status. Objects can be created or destroyed such as when a sensor is used to detect an object's presence. The values of properties themselves can be determined by constraints that are evaluated separately from any skill invocation that can affect how a skill will interact with a given situation.

Regardless of how a skill is formulated, at some point, the devices have to actually do something. As previously noted, this is called the behavior. A behavior is what world objects do: a robot moves, a timer ticks, a work piece gets worked, etc. In this context, a number of different ways to cause behavior to occur may be provided: property setting, method call, function block, and custom skills. The diversity in methods reflects a desire to maintain a convenient interface for different kinds of functions and semantics. A simple function with one parameter might be best reflected with a property. A complicated function with many parameters and synchronous call semantics may best be implemented as a method call.

One way to make a behavior respond is to change values in its object's properties. For example, a gripper may have a "grasp" property whose value is a floating-point value in range 0.0 to 1.0. When set to 1.0, the gripper is fully open; when set to 0.0, the gripper is closed. Setting the value at run time changes the set point of the gripper. The gripper moves in response and may, when finished, toggle a stopped event using another property.

Another means to implement a behavior is with an object method. World objects are defined by classes. As part of the class definition, the class implementer (normally the machine builder) may provide custom methods that can be called to perform actions on behalf of the object. Methods are useful for activities that can be easily expressed as a procedure call. An example is commanding a robot to move by setting the positions of all axes to a set of values. This might be considered more convenient than setting individual robot axis properties since it is implicit that all axis values are set at the same time. One may also want to have different ways to activate behavior that can more easily be described by using different methods with different names. For example, a robot may move to a point with one method; in a second method, a robot may move to a point but be set to stop under a force threshold.

Figure 10:
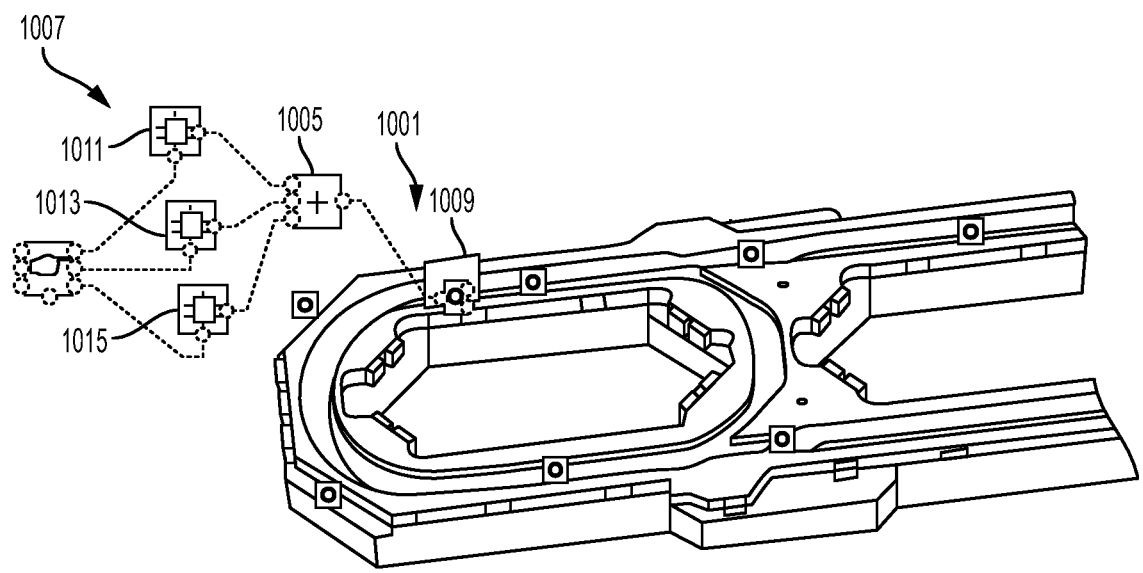
FIG. 10 is an illustration of the use of a function block in a conveyor track system according to embodiments of the present disclosure.

A function block is an object-based technique to represent a function similar to what is done in PLC programming. A function block has a state similar to an object, but it is also activated like a function. In FIG. 10, a carrier puck 1009 in a smart conveyor track system 1001 is being controlled by a function block as its input. In this representation, the function block appears as a circuit element 1007 whose input is tied to the device object, in this case the carrier puck 1009. Different kinds of function blocks would carry out different behaviors associated with the device. In FIG. 10, a selection of three different functions 1011, 1013, 1015 are being applied to the puck 1009 as represented by the three rows of circuits being joined at 1005 to form the input to the puck 1009.

A custom skill is just a way of noting that some kinds of functions are complex and ought to be coded using a lower-level language for efficiency. It is not that such a skill could not be specified as a combination of other skills at the application engineering level. It is just more convenient to hard-code the skill's behavior directly. The engineering system supports this in the same way that the behavior of any world object is supported. A skill is a kind of object in the engineering system just as a robot is a kind of object. A skill can have behavior. A simple skill can have a simple behavior, like setting the value of another object's property. A complicated skill can have complicated behavior, like determining the best route in an intelligent conveyor system without causing collisions.

A composite skill is simply a skill that is formulated by assembling a set of other skills. From an implementation standpoint, all skills may be composite in the sense that they cause behaviors of the various devices to come into play. In an aspect, the methods of this disclosure may assist an application engineer to assemble new skills for an automation program by combining the effects from other skills using engineering building blocks. The building blocks are based on common programming operations such as iteration, conditions, sequences, etc.

The semantics of a typical composite skill might be to execute a set of skills in sequence as a sequence block or a skill sequence. The data encoded in the skill sequence is the ordered list of sub-skills that will be executed. The behavior of the skill sequence is to invoke each sub-skill in order one at a time. Other kinds of composition blocks, like if-then or loop, would have corresponding behavior implementations.

Being able to compose new skills is a necessary benefit to the application engineer. It is not reasonable for a manufacturer to be able to anticipate the need for all interactions a device might have in a particular situation. A common example would be interactions that employ multiple devices like a robot with its gripper. It is typical that the manufacturer for a robot is not the same as the manufacturer of a gripper. The gripper may even be hand built by the application owner out of constituent parts. The manufacturer of the robot has no way to know in advance what kind of gripper the application engineer plans to attach. Some use cases, like using a robotic gripper, may be possible to anticipate, but in the general case it is unknowable.

The programming structural blocks are only a part of the needed information to form a program. The other needed elements are data representation and formulaic expressions. The data representation is handled in the world model at least at the global level. Local variables may be established in skill block composition. What remains is the expression language.

The expression language handles the basic data manipulation functions like operators (e.g., addition, multiplication, modulo, etc.), as well as structural climbing functions finding parents and parts of objects, searching for objects with specific properties, fetching properties from object, etc.

The typical approach to implement an expression language is to provide a parser. A Simula-like textual language with infix operators may be applied, or a graphical constraint language like Simulink where operators are joined in a graphical node and line diagram representing dataflow. Dataflow diagrams tend to be simpler to write, but harder to read and understand. Textual languages tend to be simpler to read because they are more compact, but they are much harder to write and can still be difficult to understand.

The parameters for skills appear as references to objects in the world model. The object references may be extracted from atomic skills and expressions, then it may be determined which ones are not a known object. A reference to a particular known object would be a constant global reference (the object itself is not constant, the reference is fixed). Any other reference would be either a derived reference such as taking an object and finding one that is attached or otherwise linked to it or it would be a reference that is passed as a parameter. The skill blocks require a mechanism to pass object references from parameters to the sub-skills.

Figure 11:
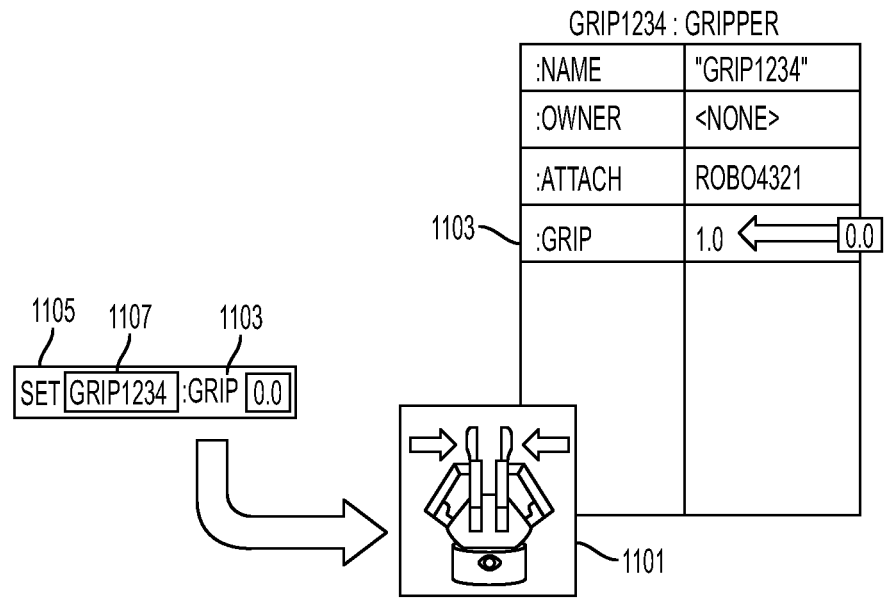
FIG. 11 illustrates the use of a skill having a reference to another object according to embodiments of the present disclosure.

Note that the skills are objects in the same way that physical entities are also objects. Skills are derived from classes and have properties. For a skill to affect another object, it must be able to generate a reference to that object. For a constant reference, the reference to the object is embedded in the skill itself. The reference to a world object is stored directly in a property of a skill. FIG. 11 shows an example of generation of a setting for a skill property to close a gripper 1101. A parameter table is shown in FIG. 11 for the gripper 1101 with fields for name, owner, attachment and a grip property 1103. The behavior of the gripper is provided by the grip property 1103. In this example, the gripper name is Grip1234, and the skill is attached to robot Robo4321. Setting the grip property 1103 to zero closes the gripper. This setting may be executed by receiving an input from an application engineer (e.g., using a GUI), shown as Set skill 1105 for setting the gripper property 1103. The Set skill 1105 points directly to the gripper name 1107 and when it is invoked, the gripper 1101 closes.

Figure 12:
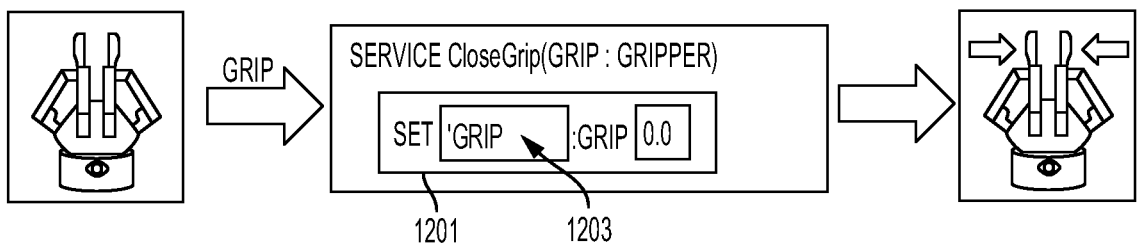
FIG. 12 illustrates the use of a stand-in for a world object for receiving a passed reference to a skill according to embodiments of the present disclosure.

Referring now to FIG. 12, an example is shown of a symbolic stand-in used for a passed reference. The stand-in represents a kind of world object and can be included in the expressions that do the work of the skill. At runtime, the symbolic stand-in is transformed into a reference to an actual world object and the expressions apply to it for real. For example, the symbolic stand-in might be a reference to a local variable where the result of an expression is stored. In FIG. 12, a Set skill 1201 uses a symbolic stand-in 1203 identifying which gripper to close. The expression 1203 in this case is a parameter of the enclosing skill 1201.

Figure 13:
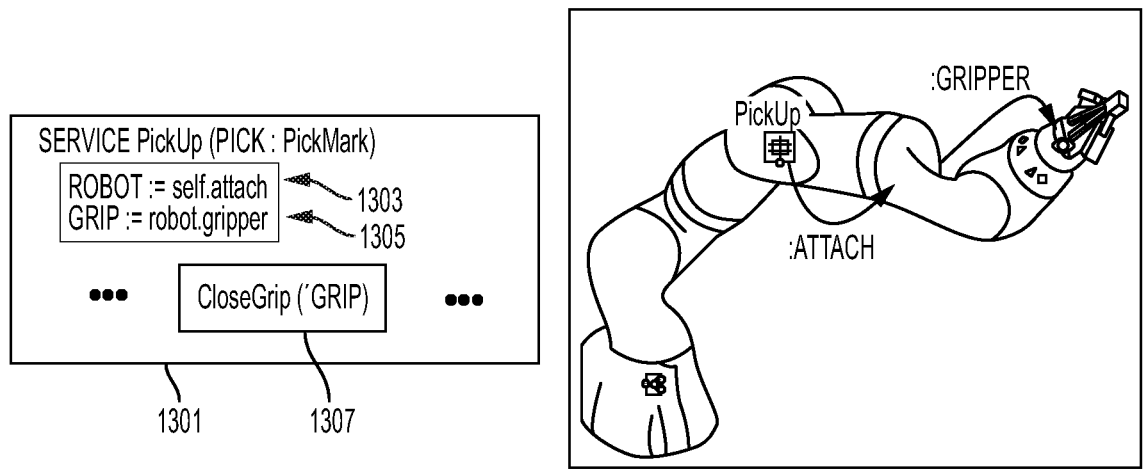
FIG. 13 is an illustration of a self-reference to an object for applying a skill according to embodiments of the present disclosure.

FIG. 13 is an illustration of a self-referencing skill attached to an object according to embodiments of the present disclosure. The skill itself is a world object and can be used as a global reference to find other connections. By attaching the self-referencing skill to the robot that is intended to do the work, the skill automatically finds the robot to perform the task. To find the robot, the skill 1301 uses an expression that refers to itself (like a "this" pointer) and reads its attached property to find the robot 1303. The skill refers to itself as "self" and from there finds the gripper object 1305 to pass as a parameter to one of its sub-skills 1307.

One of the difficulties of implementing skills is knowing which activities can be conducted in parallel and which need to be serialized. In typical programming, parallelism is written into the program code explicitly. If the programmer's intuition about which code can execute simultaneously is wrong, then problems occur. Typically, when two code fragments execute simultaneously on a single device, the outcome is not predictable and usually catastrophic.

By providing context, the world objects provide a means to manage common resources automatically while preventing the most egregious parallelism failures. The object grouping that constitutes a skill includes not only the code of the skill but also the set of all objects that are affected by the skill. If a skill sets a gripper's open position to 0.5 then the gripper is a member of the skill's set of objects. Suppose a "Pick" skill is running on a first robot (Robot1) to which Gripper1 is attached. If a second robot is part of the same unit, say Robot2 with Gripper2, then it should generally be okay to start a "Place" skill on Robot2 even though a Pick skill of Robot1 is not yet completed.

However, simply because objects used in a skill are not identical does not mean that any skills that affect different objects should be run simultaneously. For example, if a Pick operation is running on a first robot Robot1, it is not possible to run a gripper Release skill simultaneously on the gripper attached to the robot doing the pick. Though seemingly obvious for a person observing the situation, it is not obvious for the system. The majority of time that the pick is running, the gripper holds the piece, but its local state is not changing. For this reason, the extent of the world objects must be considered, and not just the object itself. The extent of a world object includes the object itself as well as all the other objects that are attached to it. A Release skill operating on Gripper1 is forbidden to start if a Pick skill on Robot1 is running. This is because Gripper1 is attached to Robot1 so even if Gripper1 is not being modified at the given moment, it is locked until the objects to which it is attached become available.

Determining which objects are shared between skills can be complicated. Continuing with the example of a Pick skill running on Robot1, the system may be faced with another skill being invoked that shares an object but only referenced indirectly. Consider a "Transport" skill being applied to a work piece (labelled "Piece"). Assume that transporting the piece requires driving a mobile platform, "Mobile", on which the piece is placed. Determination of which platform to drive could come in the execution of an internal skill. The mobile platform also holds Robot1 as it turns out (Robot1 is attached to Mobile). This information is readily available because it is part of the world model. Mobile is locked so the Transport skill must block until the Pick skill is completed since the robot's mobile platform should not be driving away while the robot on top is reaching out for a part. For implementation, the invocation of "Transport" does not start until one finds the resource contention and then freeze its execution until its resources are unblocked. All objects that a skill will reference may be evaluated and execution may commence once all objects are available.

Figure 14:
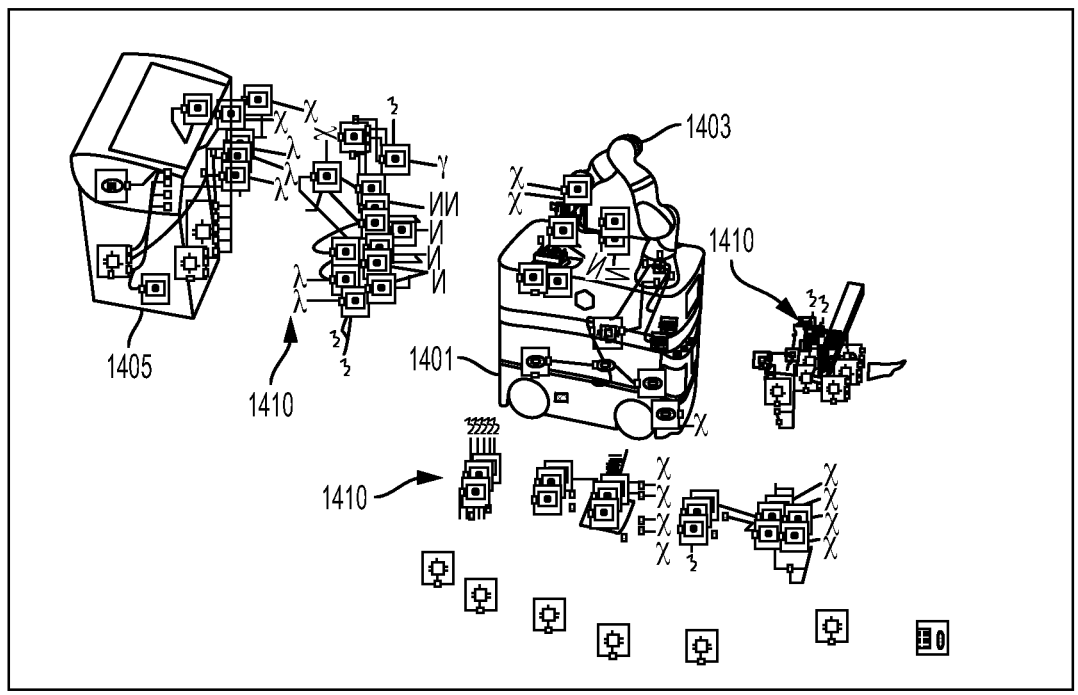
FIG. 14 is an illustration of a machine tending application showing an excessive number of generic tag markers according to embodiments of the present disclosure.
Figure 15:
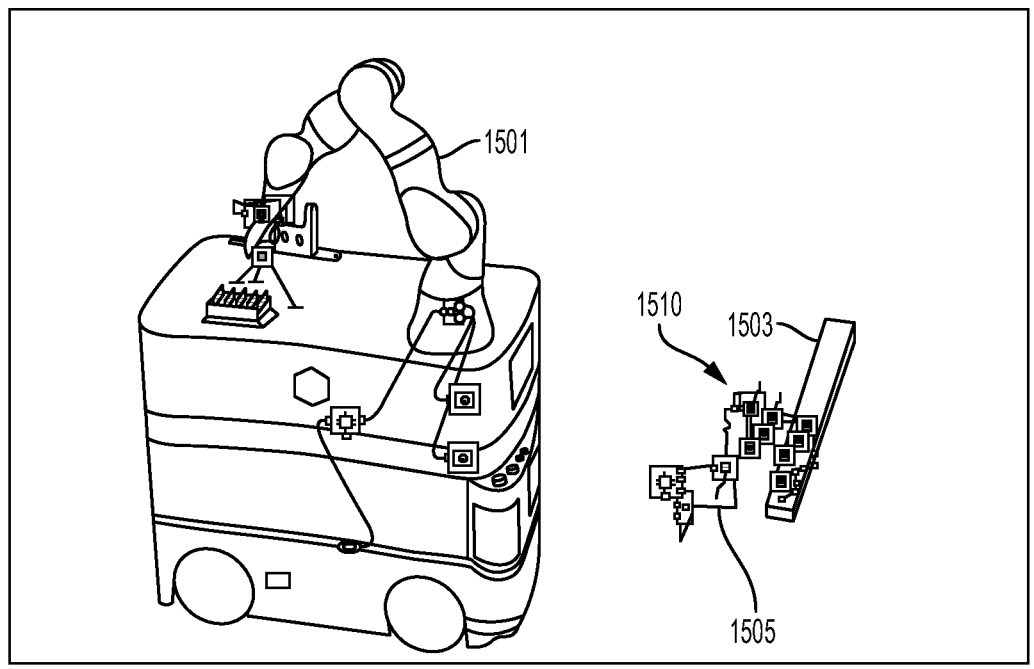
FIG. 15 is an illustration of the machine tending application of FIG. 14, showing more compact markers that are representative of the semantic meaning of a skill according to embodiments of the present disclosure.

FIG. 14 and FIG. 15 are illustrations of autonomous systems using a marking scheme for programming and control according to embodiments of the present disclosure. A major drawback of using a marking scheme for programming is controlling how much detail is presented to the user. In FIG. 14, a marked-up application is shown for controlling a mobile platform 1401 and robot 1403. This particular system has four different commands including packaging a set of work pieces, replenishing its stock of work pieces, and tending the laser cutter 1405. When all the markings 1410 for all the different robot actions are put together, the result becomes a messy clutter.

As shown in FIG. 15, by simply reducing the markers 1510 to those that are being used by a single function, the amount of clutter is significantly reduced. In FIG. 15, the markers 1510 are reduced to only those used to calibrate the position of robot 1501. The robot 1501, on first activation, drives over to the conveyor area 1503 being represented by a long box region that is one of one or more one-meter tracks. The robot 1501 then reaches over and touches the conveyor 1503 at three positions. The positions shown with markers 1510 on the conveyor are the spots being touched, but also markers 1510 aside from the conveyor are arranged to show the robot approach vector and other attributes. The reference object 1505 is generated to represent stored results of the calibration in 3D space. The diagram as shown may not be considered to be especially readable, however, for perhaps the markers 1510 may be overly generic and overlapping.

Figure 16:
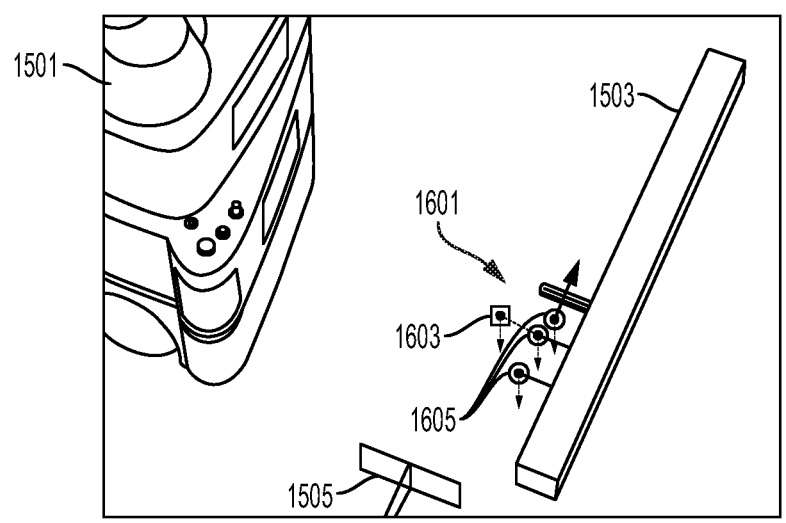
FIG. 16 is an illustration of different types of markers having different graphical representations according to embodiments of the present disclosure.

In FIG. 16, the generic tag markers of FIG. 15 have been replaced with more compact markers 1601 as an enhancement, whereby markers 1601 carry more of the semantic meaning of what the skill is intending to accomplish. Like the generic markers, the compact markers 1601 are fully embedded in the 3D space and will move accordingly when the scene is rotated. While a user may not easily visually recognize the purpose of the markers 1601 like in a diagram, accompanying text may be added to the markers 1601 as additional guidance. In this example, the dots represent position where the robot gripper is sent to start a movement. The squared dot 1603 is the homing starting position, and circled dots 1605 are the spots where the robot 1501 starts a touching pass. The robot 1501 touches the conveyor 1503 three times starting from a circled dot 1605 and moving in the direction of the arrow. In an aspect, running a simulation of the robot 1501 operation for the programmed skill can be used to demonstrate the meaning of the markers to an application engineer.

In order to provide information hiding so that the user need only see the markers for a particular skill, the marker objects themselves can be made part of the skill itself. A composite skill can contain sub-skills, for example, but it can also contain references to the markers used as parameters. In this way, a skill can also observe and set values in the markers to affect different activities. A marker may be moved to follow the action in a camera, for example. As an example, a calibration routine designed to cover four robot motions will have associated markings that describe where to carry out the motion. The markers are actually members of the skill and they also are used as parameters to sub-skills, such as performing a sweep to touch motion to touch the conveyor. Unlike physical objects, the members of a skill object may be re-used in other skill objects. The same "sweep to touch" skill can show up as many times as needed but still have the same implementation for all. Similarly, a marker used in one skill could also be used in another. Data hiding is enabled because the system can restrict which markers are shown depending on which skill is currently selected. The only top-level markers that may be shown all the time would be the top-most service level skills defined by the application.

Figure 17:
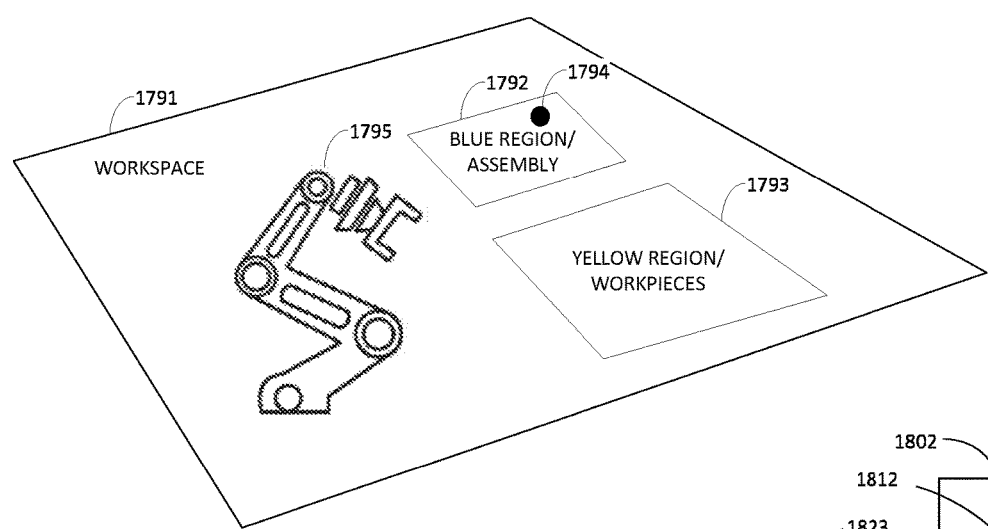
FIG. 17 is an illustration of regional semantic markers according to embodiments of the present disclosure.

FIG. 17 is an illustration of regional semantic markers according to embodiments of the present disclosure. In an embodiment, one or more autonomous devices are controlled by at least one controller to manipulate workpieces according to tasks for a production process. In some embodiments, an autonomous system may be implemented for assembly of workpieces into a work product. To perform assembly behaviors in an application, a new skill may be added to a control program of a controller for one or more devices to represent assembling of a work product and a small number of new markers to represent what to assemble and how. For example, a robotic gripper may be a device controlled by an autonomous controller that generates a world model with data objects representative of a workspace, the workpieces and the device. Applying the world model, the controller may attach semantic markers to the data objects such that each of the semantic markers include information related to a skill defined as an abstract function for accomplishing a task objective. The controller synchronizes the world model with the physical objects of the autonomous system by updating status of data objects as functional tasks are executed and by arranging and mapping data objects based on location information of physical objects obtained from sensors.

As shown in FIG. 17, a data object for workspace 1791 is defined, along with a data object for robotic device 1795. In order to better control semantic markers attached to data objects, regions of the workspace 1791 are defined and may be visually enhanced for the simulation by applying unique colors to the field, a colored frame of the field, or the like. As shown in FIG. 17, a blue region 1792 and a yellow region 1793 are defined to represent an assembly region and a region for available workpieces, respectively. For example, the yellow region 1793 can designate the space where workpieces to be assembled can be located and the blue region 1792 can designate where the workpieces are being assembled. The blue region 1792 and yellow region 1793 are examples of semantic markers and the semantics of these objects are programmable. In an aspect, the blue region 1792 may be used to activate markers of data objects that are within its region and the yellow region 1793 may act as a search space where work pieces may be placed. Different kinds of applications can use more or less regions with varying semantics depending on the complexity of the tasks. For example, other tasks, such as cutting or grinding of workpieces, may also have separate workspace regions. In an embodiment, two or more devices 1795 are deployed in the autonomous system, and the semantic markers are programmed with semantics that allow two or more devices to collaboratively perform the tasks without device-specific instructions.

Continuing with the assembly example, a first task may be defined to move the first few workpieces to the assembly region 1792. Since the assembly region 1792 starts empty, a pickup and placement operation may be selected to move workpieces into the assembly region 1792 based on fixed placement markers 1794 already defined and arranged. For the assembly task, separate skills may be defined to achieve the objective, such as a pickup skill for the device 1795 to grip a workpiece and lift it, a placement skill that puts the workpiece down onto a designated workspace location, and an assembly skill that couples the workpiece to another workpiece that the device 1795 may find. In an aspect, the functions of these skills are general in that they are applied sequentially and are not limited to single objects in the world model, nor are the functions device-specific, which affords flexibility and scalability to the autonomous system.

Additional semantic markers may include the following. A pick spot marker can be attached to a designated region of the workspace 1791, such as the yellow region 1793 to designate all the workpieces that need to be assembled. A bottom spot marker can represent a specific type of placement marker 1794 at locations where bottom workpieces are needed for assembly. A hole piece marker may represent any and all of the active hole markers in the world model, in conjunction with a counterpart peg piece marker that represents any and all of the active peg markers in the world model, where a peg of one workpiece fits into a hole of another workpiece in the assembly. Generating such markers provides sets of data objects for one or more of the device 1795 to operate upon via one or more controllers.

The semantic markers may be set to an activated state to trigger applicable skills for device operation. For example, workpieces in the blue region 1792 may be collectively activated to trigger the skill set for an assembly task, such as one or more of pickup, placement, and assembly skills. Alternatively, workpieces in a workspace region may be activated individually using a particular semantic marker. In an aspect, semantic markers attached to data objects may be set to a deactivated state for objects not to be currently manipulated by the one or more devices 1795.

The autonomous controller may generate the world model to include an anticipation function using the semantic information of the semantic markers. An anticipation function may also be considered a kind of pre-condition on which a skill decides whether to proceed. In an aspect, conditions for performing a task can be based on sequential requirements, such as defining a semantic marker that requires subsequent skills to be accomplished successfully. For example, the controller may define and attach semantic markers for pickup and placement such that only objects of a particular type (e.g., color, size, etc.) are to be placed first in the assembly sequence (e.g., as bottom pieces). Such information may be stored in the pickup and placement markers.

Additionally, the semantic markers may include information that indicates where and how the object is to be placed. Accordingly, if the assembly task required a black workpiece and a gray workpiece to be placed first, then a tan workpiece will not be picked up by the autonomous device since there is no objective to do so. The anticipation function may rely on sequential tasking, to control the device operation to apply a first task until all data objects requiring manipulation have been tended to. Without finding any further data objects related to the first task, the device autonomously proceeds to execute skills guided by the semantic markers for the second task until complete, and so on for successive tasks of the sequence.

The anticipation function can be applied based on the types of physical objects, types of data objects, kinds of skills, and also the configuration of the data objects in the world model. For example, the place where a workpiece is set may be determined based on whether it blocks placement of subsequent workpieces. The workpiece that is picked up may be determined based on whether there is a collision free path to reach the workpiece. For the assembly task, a workpiece should not be assembled if it will block the assembly of a later workpiece. Anticipation functions may be programmed directly into the algorithms of the skill as provided by the semantic information or it may be programmed by the user such as by activating key semantic markers (e.g., via a GUI).

Figure 18:
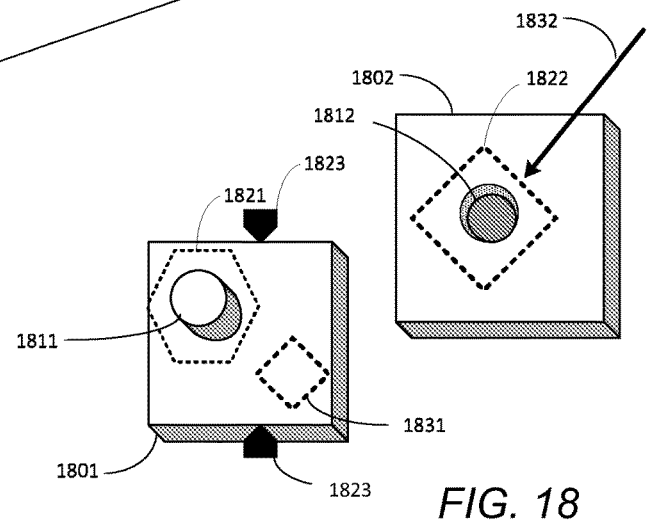
FIG. 18 is an illustration of semantic markers related to skills for an assembly task according to embodiments of the present disclosure.

FIG. 18 is an illustration of semantic markers related to skills for an assembly task according to embodiments of the present disclosure. In an embodiment, the anticipation function is programmed to direct which pieces to assemble in which order by using "peg" and "hole" markers. In FIG. 18, a data object for workpiece 1801 has a peg structure 1811 to which a peg marker 1821 is attached. Pickup markers 1823 indicate a gripping position for the workpiece 1801. A hole marker 1831 indicates the presence of a hole on the bottom of workpiece 1801 (not visible). Such a hole may be matched to a peg of another workpiece for a later assembly task. Also shown is a data object for workpiece 1802 having a hole structure 1812 with a hole marker 1822 attached. The peg marker 1811 is matched with the hole marker 1822. For the assembly, pegs go into holes and the local orientation of the marker relative to the part shows how the connection is made. The arrow line 1832 part of the hole marker 1822 and shows what path the peg workpiece 1801 should follow in order to be correctly inserted over the hole. Alternatively, peg markers may include an arrow line to guide a hole workpiece placement onto the peg.

In an embodiment, all of the peg markers may be colored a particular color representing an inactive state. Hole markers attached to inactive pegs are likewise not active and will be skipped for consideration of getting picked up via the anticipation function. The inactive markers may become activated by placement of the workpiece into the blue region 1792, for example, controlled by the semantic marker program attached to the blue region 1792. Once the peg markers are activated, the semantic marker program may control a color change to the activated markers (e.g., change from a dull color to a bright color). By assigning the pegs and holes attached to each workpiece the correct connectivity, the hole markers for that piece will be all become active unless it is not feasible to assemble that piece. As more and more workpieces become assembled, their markers become active causing the remaining workpieces to become active.

The system can be generalized to assembling data objects of workpieces where there is not a one to one connection between objects such as a stack of generic objects by connecting pegs and holes using relationships instead of static objects. As more workpieces become available to be picked up, it becomes more important to control which workpieces are selected. This can be managed by applying filter functions to the skills and by creating triggering regions that react when workpieces are placed and removed from their vicinity.

To apply adhesives or perform welding and other kinds of tool-based actions, the markers can be supplemented with additional markings that represent where the glue or weld or other activity occurs. Like the assembly task, subsequent operations can be made to wait by giving the tasks with adhesion markers higher priority. This way, parts do not get placed where the robot needs to be used for immediate operations.

Because the skills technique describes the outcome, it is easier to retarget an application to perform different but similar task without changing the tasks. By putting different objects into the world model, perhaps at different places with different connections, the system will perform a different task automatically. This cannot work when using instructions because the actions being specified have little to do with the work products. The robot would just perform moves on non-existent parts and collide with others in the wrong spots.

Applying generalized skills improves error recovery. For example, if a robot drops a workpiece, a sensor can detect where the workpiece fell. The tasks do not need to be changed necessarily because it is still the application's task to perform its original operation. It will just do so with a new initial configuration.

The skills-based techniques described above allows for anticipation for desired results to be built directly into skills and not be solely reliant on the user to program anticipation directly by instructions. Common situations such as blocked paths, number of available parts, and configuration of tools can be handled by algorithms in the skills without programmer intervention.

In this disclosure, autonomous systems and methods of autonomous systems assist application engineers to rapidly and intuitively design and configure industrial processes based on generic skills that are not bound to specific units but represent the functions of a unit in terms of how it transforms work products.

An architecture is proposed that is based on the generation, modification, and sharing of a World Model that captures the devices, material, work products, locations, skills, etc. that are relevant for an industrial process. To create an industrial process, an application engineer uses the described tools to create a collection of Process Objects that comprise an abstract functional specification of the engineered process for its simulation and execution on actual hardware. The execution of an engineered process depends on Component Definitions that link the process specification to the actual implementation of machine Behavior (for simulation, this behavior is replaced with simulated behavior via simulation-specific component definitions). An Execution Engine that runs on the ASR Runtime controls the execution of Process Objects, and the execution process and current system state are visualized using an Execution UI.

The described concepts provide a higher level of abstraction for application engineers to design industrial processes that depends on a library of reusable skills to simplify the programming and orchestration of industrial devices. The main benefits of this approach include accelerated (re) configuration of industrial setups and generic solutions to be deployed multiple times and on different types of hardware (e.g., pick-and-place processes are ubiquitous in industrial facilities). In addition, the separation of the logical specification of an industrial process from its actual execution hardware will lead to libraries of these specifications that stay valid even as the hardware, its controllers, and their APIs change. Finally, managing production systems on a higher abstraction level should enable them to recover from unexpected situations without requiring the engineer to anticipate all possible failure conditions.

Figure 19:
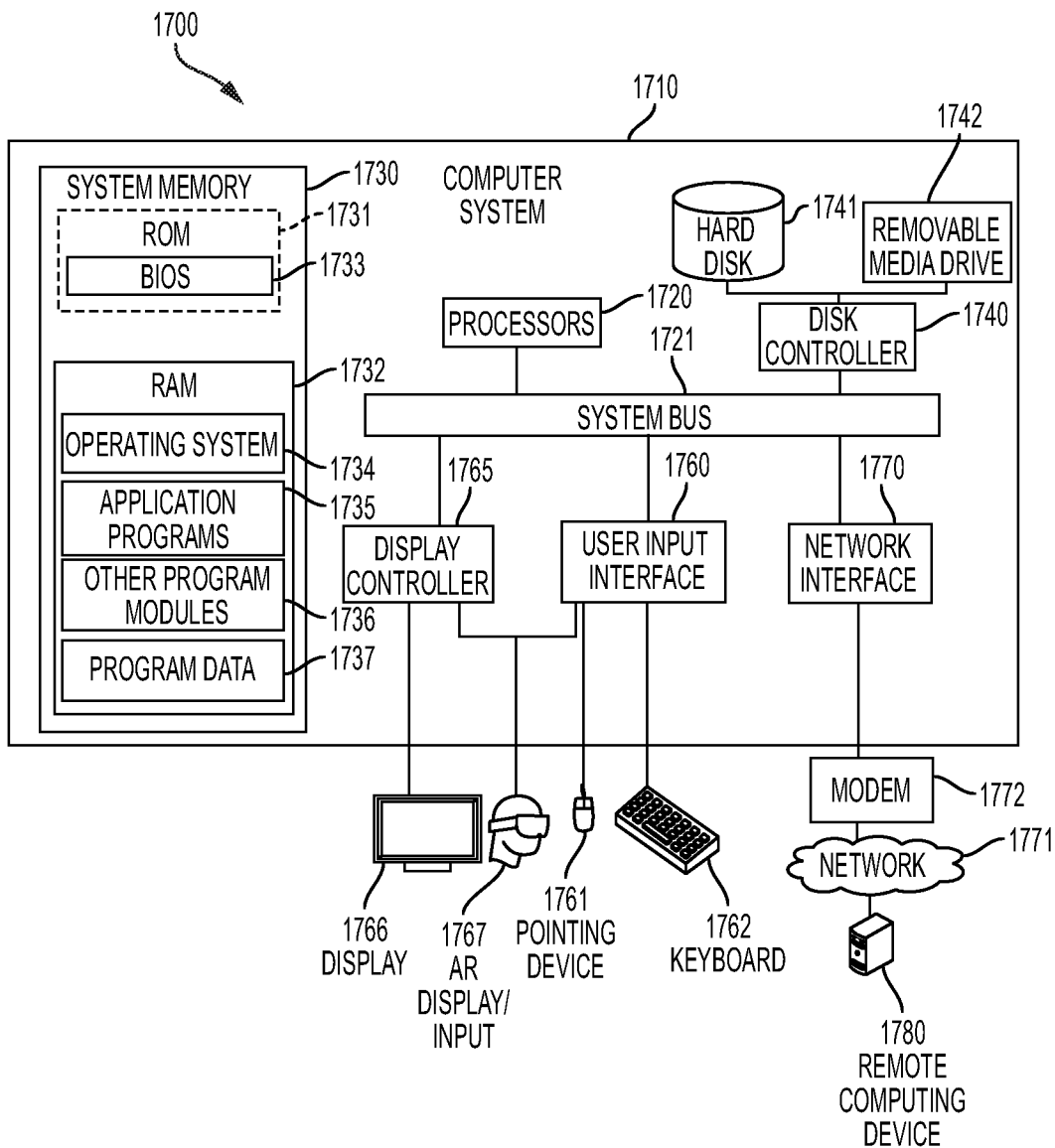
FIG. 19 is a block diagram of a computer system that may be used to implement aspects of embodiments of the present disclosure.

FIG. 19 illustrates an exemplary computing environment 1700 within which embodiments of the disclosure may be implemented. Computers and computing environments, such as computer system 1710 and computing environment 1700, are known to those of skill in the art and thus are described briefly here.

As shown in FIG. 19, the computer system 1710 may include a communication mechanism such as a system bus 1721 or other communication mechanism for communicating information within the computer system 1710. The computer system 1710 further includes one or more processors 1720 coupled with the system bus 1721 for processing the information.

The processors 1720 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general-purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 19, the computer system 1710 also includes a system memory 1730 coupled to the system bus 1721 for storing information and instructions to be executed by processors 1720. The system memory 1730 may include computer readable storage media in the form of volatile and/or nonvolatile memory, such as read only memory (ROM) 1731 and/or random-access memory (RAM) 1732. The RAM 1732 may include other dynamic storage device(s) (e.g., dynamic RAM, static RAM, and synchronous DRAM). The ROM 1731 may include other static storage device(s) (e.g., programmable ROM, erasable PROM, and electrically erasable PROM). In addition, the system memory 1730 may be used for storing temporary variables or other intermediate information during the execution of instructions by the processors 1720. A basic input/output system 1733 (BIOS) containing the basic routines that help to transfer information between elements within computer system 1710, such as during start-up, may be stored in the ROM 1731. RAM 1732 may contain data and/or program modules that are immediately accessible to and/or presently being operated on by the processors 1720. System memory 1730 may additionally include, for example, operating system 1734, application programs 1735, other program modules 1736 and program data 1737.

The computer system 1710 also includes a disk controller 1740 coupled to the system bus 1721 to control one or more storage devices for storing information and instructions, such as a magnetic hard disk 1741 and a removable media drive 1742 (e.g., floppy disk drive, compact disc drive, tape drive, and/or solid-state drive). Storage devices may be added to the computer system 1710 using an appropriate device interface (e.g., a small computer system interface (SCSI), integrated device electronics (IDE), Universal Serial Bus (USB), or FireWire).

The computer system 1710 may also include a display controller 1765 coupled to the system bus 1721 to control a display or monitor 1766, such as a cathode ray tube (CRT) or liquid crystal display (LCD), for displaying information to a computer user. The computer system includes an input interface 1760 and one or more input devices, such as a keyboard 1762 and a pointing device 1761, for interacting with a computer user and providing information to the processors 1720. The pointing device 1761, for example, may be a mouse, a light pen, a trackball, or a pointing stick for communicating direction information and command selections to the processors 1720 and for controlling cursor movement on the display 1766. The display 1766 may provide a touch screen interface which allows input to supplement or replace the communication of direction information and command selections by the pointing device 1761. In some embodiments, an augmented reality device 1767 that is wearable by a user, may provide input/output functionality allowing a user to interact with both a physical and virtual world. The augmented reality device 1767 is in communication with the display controller 1765 and the user input interface 1760 allowing a user to interact with virtual items generated in the augmented reality device 1767 by the display controller 1765. The user may also provide gestures that are detected by the augmented reality device 1767 and transmitted to the user input interface 1760 as input signals.

The computer system 1710 may perform a portion or all of the processing steps of embodiments of the invention in response to the processors 1720 executing one or more sequences of one or more instructions contained in a memory, such as the system memory 1730. Such instructions may be read into the system memory 1730 from another computer readable medium, such as a magnetic hard disk 1741 or a removable media drive 1742. The magnetic hard disk 1741 may contain one or more datastores and data files used by embodiments of the present invention. Datastore contents and data files may be encrypted to improve security. The processors 1720 may also be employed in a multi-processing arrangement to execute the one or more sequences of instructions contained in system memory 1730. In alternative embodiments, hard-wired circuitry may be used in place of or in combination with software instructions. Thus, embodiments are not limited to any specific combination of hardware circuitry and software.

As stated above, the computer system 1710 may include at least one computer readable medium or memory for holding instructions programmed according to embodiments of the invention and for containing data structures, tables, records, or other data described herein. The term "computer readable medium" as used herein refers to any medium that participates in providing instructions to the processors 1720 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 1741 or removable media drive 1742. Non-limiting examples of volatile media include dynamic memory, such as system memory 1730. Non-limiting examples of transmission media include coaxial cables, copper wire, and fiber optics, including the wires that make up the system bus 1721. Transmission media may also take the form of acoustic or light waves, such as those generated during radio wave and infrared data communications.

The computing environment 1700 may further include the computer system 1710 operating in a networked environment using logical connections to one or more remote computers, such as remote computing device 1780. Remote computing device 1780 may be a personal computer (laptop or desktop), a mobile device, a server, a router, a network PC, a peer device or other common network node, and typically includes many or all of the elements described above relative to computer system 1710. When used in a networking environment, computer system 1710 may include modem 1772 for establishing communications over a network 1771, such as the Internet. Modem 1772 may be connected to system bus 1721 via user network interface 1770, or via another appropriate mechanism.

Network 1771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 1710 and other computers (e.g., remote computing device 1780). The network 1771 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 1771.

An executable application, as used herein, comprises code or machine-readable instructions for conditioning the processor to implement predetermined functions, such as those of an operating system, a context data acquisition system or other information processing system, for example, in response to user command or input. An executable procedure is a segment of code or machine-readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof.

What is claimed is:

1. An autonomous system used for a production process, comprising:
   at least one device configured to manipulate workpieces according to tasks for the production process, the at least one device comprising:
   a controller comprising a memory having stored thereon executable instructions, and a processor configured to execute the instructions to perform steps comprising:
   generating a world model of the autonomous system comprising data objects, wherein one or more of the data objects represent respective physical objects in the production process as a virtual representation in a simulation, wherein types of the respective physical objects comprise:
   a workspace,
   one or more workpieces in the workspace, and
   the at least one device;
   attaching semantic markers to the data objects, wherein each of the semantic markers includes information related to a skill defined as an abstract function that is to accomplish a task objective;
   setting a first set of the semantic markers to an activated state to trigger applicable skills for the data objects on a condition that the respective physical objects are currently available for a task performance;
   setting a second set of the semantic markers to a deactivated state for the data objects not to be currently manipulated according to the tasks of the production process; and
   controlling the at least one device to perform tasks for the production process guided by the semantic markers relying on an anticipation function with reasoning operations based on types of physical objects, types of skills, and configuration of the data objects.

2. The system of claim 1, further comprising two or more of the at least one device, wherein the semantic markers are programmed with semantics that allow two or more of the at least one device to collaboratively perform the tasks for the production process without device-specific instructions.

3. The system of claim 1, wherein a plurality of the skills are defined for the at least one device including:
   a pickup skill for gripping a workpiece and lifting it,
   a placement skill for placement of the workpiece onto a designated workspace location, and
   an assembly skill for coupling a workpiece with another workpiece.

4. The system of claim 3, wherein the anticipation function prevents the placement skill for the at least one device on a condition that the placement blocks subsequent placements of other workpieces.

5. The system of claim 3, wherein the anticipation function permits the pickup skill for the at least one device on a condition that there is a collision free path available for gripping the workpiece and lifting it.

6. The system of claim 1, wherein the production process is assembly of workpieces into a work product, the steps further comprising:
   adding a skill for assembling by defining new semantic markers programmed with semantics to designate the workpieces to be assembled and how to assemble the work product.

7. The system of claim 6, wherein the steps further comprise:
   defining one or more of the semantic markers to include identification of workspace divisions, wherein a first workspace division is defined as a region having available workpieces to be assembled and a second workspace division is defined as a region in which assembly of the workpieces is performed;
   wherein the semantic markers for workpieces in the first workspace division are activated collectively by a semantic marker for the first workspace division.

8. The system of claim 1, wherein the at least one device includes a robotic gripper with a gripper style, and at least one of the semantic markers includes an identification of a gripping location on a workpiece based on the gripper style.

9. The system of claim 1, wherein the steps further comprise:
   synchronizing the world model with the physical objects of the autonomous system by updating status of the data objects as functional tasks are executed and by arranging and mapping the data objects based on location information of the physical objects obtained from sensors.

10. The system of claim 1, wherein the steps further comprise:
    defining one or more of the semantic markers for workpieces that include a peg marker attached to a peg structure of a first workpiece, the peg marker matched to a hole marker attached to a hole structure of a second workpiece, wherein the anticipation function is programmed to direct the first workpiece to be assembled with the second workpiece by matching the peg marker and the hole marker.

11. The system of claim 1, wherein each data object is representative of a physical aspect and a logical aspect of the physical object it represents.

12. The system of claim 1, wherein the world model is designed based on the objectives of the system, and not on the manner of how the objective is achieved.

13. A method for an autonomous system used for a production process, comprising:
    generating a world model of the autonomous system comprising data objects, wherein one or more of the data objects represent respective physical objects in the production process as a virtual representation in a simulation, wherein types of the respective physical objects comprise:
    a workspace, one or more workpieces in the workspace, and
at least one robotic device configured to manipulate workpieces according to tasks for the production process;

attaching semantic markers to the data objects, wherein each of the semantic markers includes information related to a skill defined as an abstract function that is to accomplish a task objective;

setting a first set of semantic markers to an activated state to trigger applicable skills for data objects on a condition that the physical object is currently available for a task performance;

setting a second set of semantic markers to a deactivated state for data objects not to be currently manipulated according to the tasks of the production process; and controlling the at least one robotic device to perform tasks guided by the semantic markers relying on an anticipation function with reasoning operations based on types of physical objects, types of skills, and configuration of the data objects.

14. The method of claim 13, wherein the production process is an assembly of workpieces into a work product, the method further comprising:

adding a skill for assembling by defining new semantic markers programmed with semantics to designate the workpieces to be assembled and how to assemble the work product.

15. The method of claim 14, further comprising:

defining one or more of the semantic markers to include identification of workspace divisions, wherein a first workspace division is defined as a region having available workpieces to be assembled and a second workspace division is defined as a region in which assembly of the workpieces is performed;

wherein the semantic markers for workpieces in the first workspace division are activated collectively by a semantic marker for the first workspace division.

* * * * *